United States Patent
Hidaka et al.

(10) Patent No.: US 6,400,621 B2
(45) Date of Patent: Jun. 4, 2002

(54) SEMICONDUCTOR MEMORY DEVICE AND METHOD OF CHECKING SAME FOR DEFECT

(75) Inventors: Hideto Hidaka; Mikio Asakura; Kiyohiro Furutani; Tetsuo Kato, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/912,518

(22) Filed: Jul. 26, 2001

Related U.S. Application Data

(62) Division of application No. 09/385,582, filed on Aug. 27, 1999, which is a continuation of application No. 09/058,885, filed on Apr. 13, 1998, now Pat. No. 5,999,464, which is a continuation of application No. 08/752,419, filed on Nov. 19, 1996, now Pat. No. 5,764,576.

(30) Foreign Application Priority Data

Nov. 28, 1995 (JP) .............................. 7-309609
Sep. 5, 1996 (JP) .............................. 8-235053

(51) Int. Cl.$^7$ .................................. G11C 7/00
(52) U.S. Cl. .................. 365/200; 365/201; 365/230.06
(58) Field of Search ................. 365/200, 201, 365/185.09, 189.07, 230.06

(56) References Cited

U.S. PATENT DOCUMENTS

| | | | |
|---|---|---|---|
| 4,055,754 A | 10/1977 | Chesley | 365/201 |
| 4,860,260 A | 8/1989 | Saito et al. | 365/201 |
| 4,996,670 A | 2/1991 | Ciraula et al. | 365/200 |
| 5,113,371 A | 5/1992 | Hamada | 365/200 |
| 5,241,501 A | 8/1993 | Tanaka | 365/201 |
| 5,247,481 A | 9/1993 | Conan | 365/200 |
| 5,313,424 A | 5/1994 | Adams et al. | 365/201 |
| 5,327,382 A | 7/1994 | Seno et al. | 365/201 |
| 5,343,429 A | 8/1994 | Nakayama et al. | 365/200 |
| 5,377,146 A | 12/1994 | Reddy et al. | 365/200 |
| 5,400,342 A | 3/1995 | Matsumura et al. | 371/21.2 |
| 5,404,331 A | 4/1995 | McClure | 365/200 |
| 5,430,678 A | 7/1995 | Tomita et al. | 365/200 |
| 5,530,674 A | 6/1996 | McClure et al. | 365/201 |
| 5,544,106 A | 8/1996 | Koike | 365/200 |
| 5,617,364 A | 4/1997 | Hatakeyama | 365/200 |
| 5,631,868 A | 5/1997 | Termullo, Jr. et al. | 365/200 |
| 5,636,167 A | 6/1997 | Lee et al. | 365/200 |
| 5,652,725 A | 7/1997 | Suma et al. | 365/200 |
| 5,764,576 A | 6/1998 | Hidaka et al. | 365/200 |
| 5,999,464 A | 12/1999 | Hidaka et al. | 365/200 |
| 6,002,621 A | * 12/1999 | Tanaka et al. | 365/200 |
| 6,160,745 A | * 12/2000 | Hashimoto | 365/200 |

FOREIGN PATENT DOCUMENTS

| | | |
|---|---|---|
| JP | 2-310898 | 12/1990 |
| JP | 3-1397 | 1/1991 |
| JP | 4-68719 | 11/1992 |

* cited by examiner

Primary Examiner—Tan T. Nguyen
(74) Attorney, Agent, or Firm—McDermott, Will & Emery

(57) ABSTRACT

A semiconductor memory device includes a first test row decoder (9a) for selecting memory cells in normal rows in a test mode, a second test row decoder (9b) for selecting spare memory cell rows, a first test column decoder (10a) for selecting memory cells in normal columns, and a second test column decoder (10b) for selecting spare memory cell columns. A control circuit (11) may perform switching between four combinations of the row and column decoders by using a control signal (SRT) and a control signal (SCT). All spare memory cells are tested prior to reparation of a defective memory cell for yield enhancement.

6 Claims, 34 Drawing Sheets

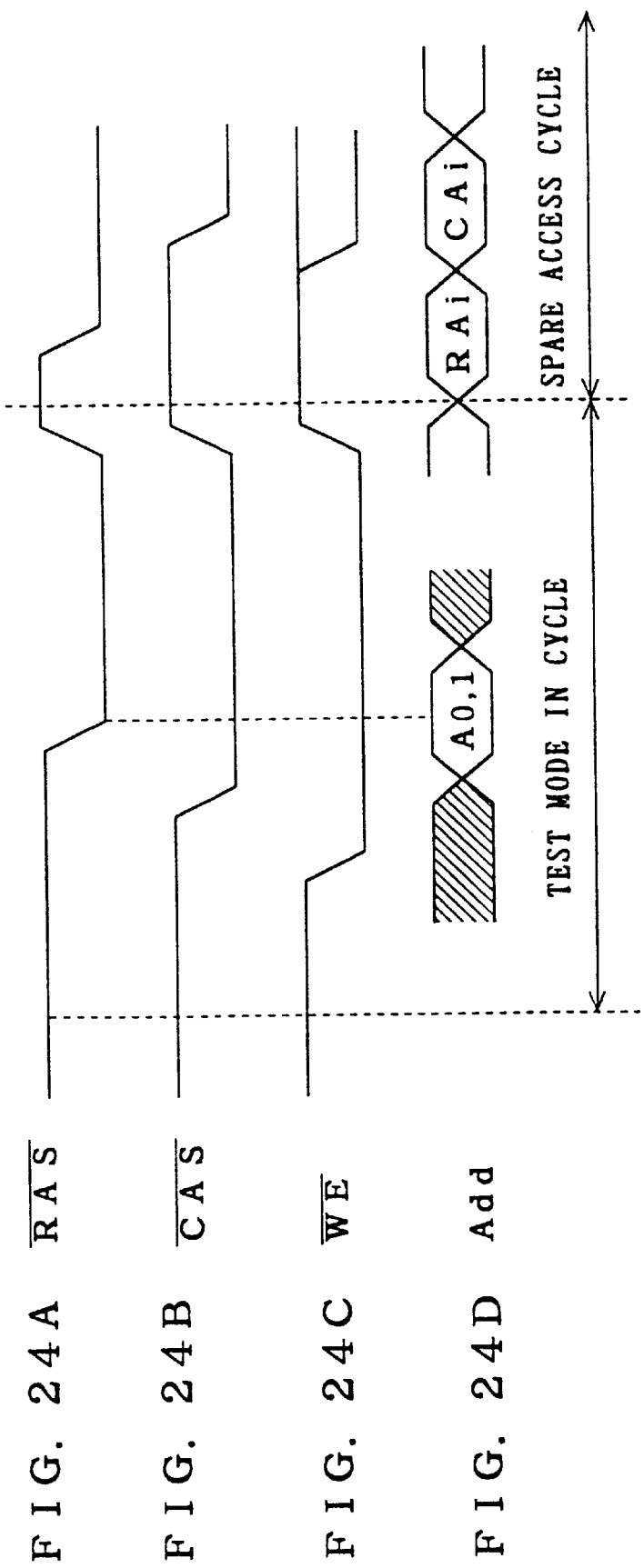

$\overline{RAS}$ $\overline{CAS}$ $\overline{WE}$

TEST MODE OUT CYCLE

SEMICONDUCTOR MEMORY DEVICE AND METHOD OF CHECKING SAME FOR DEFECT

This application is a divisional of application Ser. No. 09/385,582 filed Aug. 27, 1999 which is a continuation of application Ser. No. 09/058,885, filed Apr. 13, 1998 now U.S. Pat. No. 5,999,464 which is a continuation of Ser. No. 08/752,419, filed Nov. 19, 1996, now U.S. Pat. No. 5,764,576.

BACKGROUND OF THE INVENTION

1. Field of the Invention

The present invention relates to a semiconductor memory device having spare memory cells for repairing defects in normal memory cells and, more particularly, to checking spare memory cells for defects.

2. Description of the Background Art

FIG. 30 is a plan view of principal portions of a conventional dynamic semiconductor memory device (referred to hereinafter as a DRAM). In FIG. 30, the reference numeral 141 designates an area wherein a column of sense amplifiers are arranged (a sense amplifier forming area); 142 designates an area wherein a group of memory elements are arranged (memory cell array); 143 designates a row decoder for activating a word line specified by a row address signal for selecting a cell in the memory cell array 142; and 144 designates a column decoder for activating a bit line specified by a column address signal for selecting a cell in the memory cell array 142.

FIG. 31 conceptually illustrates the structure of an area 145 shown in FIG. 30. In FIG. 31, the reference numeral 146 designates memory cells for constituting the memory cell array 142; the reference character 147a designates word lines provided in respective rows of the normal memory cells and controlled by a normal row decoder 143a so that they are active/inactive; 147b designates a word line provided in a spare cell row in which spare memory cells are arranged and controlled by a spare decoder 143b so that it is active/inactive; 148a designates bit lines provided in respective normal columns in which the normal memory cells are arranged and controlled by a normal column decoder 144a of the column decoder 144 so that they are active/inactive; and 148b designates bit lines provided in respective spare memory cell columns in which the spare memory cells are arranged and controlled by a spare column decoder 144b of the column decoder 144 so that they are active/inactive.

The DRAM shown in FIG. 31 has a redundant construction for repairing a defect. Each memory cell array 142 includes one or more spare rows and one or more spare columns. If a memory cell is defective, the row or column containing the defect is electrically replaced with a spare row or spare column by the laser fuse programming or the like to repair the defect.

FIG. 32 is a plan view of a conventional dynamic semiconductor memory device. In FIG. 32, the reference numeral 200 designates a storage area of the dynamic semiconductor memory device; 201 designates an area wherein a column of sense amplifiers are arranged (a sense amplifier forming area); 202 designates an area wherein a group of memory elements formed between the areas 201 wherein a plurality of columns of sense amplifiers are arranged respectively are arranged; 203 designates word line backing areas for connecting metal interconnecting lines having a relatively low resistance; and 204 designates areas wherein interconnecting lines having a relatively high resistance are formed in a layer different from the word line backing areas 203 and intersecting the sense amplifier forming areas 201.

FIG. 33 conceptually illustrates the structure of the word line backing areas 203 shown in FIG. 32. In FIG. 33, the reference numeral 205 designates aluminum interconnecting lines having a relatively low resistance; and 206 designates polycide interconnecting lines having a relatively high resistance and connected in parallel with the aluminum interconnecting lines 205.

FIG. 34 is a block diagram of a memory cell block of the dynamic semiconductor memory device. In FIG. 34, the reference characters 141a and 141c designate sense amplifier forming areas wherein sense amplifiers for reading data from the normal memory cells are formed; 141b and 141d designate sense amplifier forming areas wherein sense amplifiers for reading data from the spare memory cells are formed; 148c designates bit line pairs for transmitting data read from the normal memory cells; and 148d designates bit line pairs for transmitting data read from the spare memory cells. Like reference numerals and characters are used to designate elements corresponding to those of FIG. 31.

The conventional semiconductor memory device constructed as above described has failed to effectively repair defects in the memory cells arranged in the spare rows and spare columns.

SUMMARY OF THE INVENTION

A first aspect of the present invention is intended for a semiconductor memory device switchable between a normal mode wherein normal memory cells are read/written and a test mode wherein the normal memory cells and spare memory cells provided for repairing a defect in the normal memory cells are tested for a defect. According to the present invention, the semiconductor memory device comprises: a memory cell array including normal rows and normal columns in which the normal memory cells are arranged, and at least one spare memory cell row and at least one spare memory cell column in which the spare memory cells are arranged; a normal row decoder and a normal column decoder for accessing the normal memory cells; a spare row decoder for selecting the at least one spare memory cell row in the normal modes; and a spare column decoder for selecting the at least one spare memory cell column in the normal mode, wherein an address signal for addressing the memory cell array is used in the test mode to put at least one of the at least one spare memory cell row and the at least one spare memory cell column into a selected state without using the spare row decoder and the spare column decoder.

Preferably, according to a second aspect of the present invention, the semiconductor memory device further comprises access means for accessing a first spare memory cell selected by the normal row decoder and the spare column decoder, a second spare memory cell selected by the normal column decoder and the spare row decoder, and a third spare memory cell selected by the spare row decoder and the spare column decoder in the test mode.

Preferably, according to a third aspect of the present invention, the access means decodes a normal row address signal and a normal column address signal for selecting the normal memory cells in the normal mode to select the first to third spare memory cells in the test mode.

Preferably, according to a fourth aspect of the present invention, the access means includes: a first test row decoder for decoding the normal row address signal to select the normal rows in the test mode; a second test row decoder for decoding the normal row address signal to select the at least one spare memory cell row in the test mode; a first test column decoder for decoding the normal column address signal to select the normal columns in the test mode; a second test column decoder for decoding the normal column address signal to select the at least one spare memory cell column in the test mode; and control means for setting a first condition in which the first test row decoder and the first test column decoder are operated, a second condition in which the first test row decoder and the second column decoder are operated, a third condition in which the second test row decoder and the first test column decoder are operated, and a fourth condition in which the second test row decoder and the second test column decoder are operated.

Preferably, according to a fifth aspect of the present invention, the access means includes: converting means for converting the normal row address signal and the normal column address signal to produce a test row address signal and a test column address signal in the test mode; a test row decoder for decoding the test row address signal to select the normal rows and the at least one spare memory cell row in the test mode; and a test column decoder for decoding the test column address signal to select the normal columns and the at least one spare memory cell column in the test mode.

Preferably, according to a sixth aspect of the present invention, the access means decodes a normal address signal for selecting the normal memory cells in the normal mode and an additional address signal added to the normal address signal to select the normal memory cells and the first to third spare memory cells in the test mode.

Preferably, according to a seventh aspect of the present invention, the access means performs switching between the normal mode and the test mode in response to a control signal, and is set to the normal mode when the control signal is not applied thereto.

Preferably, according to an eighth aspect of the present invention, the access means shares a portion thereof having an arrangement similar to that of the normal row decoder with the normal row decoder and shares a portion thereof having an arrangement similar to that of the normal column decoder with the normal column decoder in the normal mode and the test mode.

Preferably, according to a ninth aspect of the present invention, input timing of an address signal in the test mode to the access means is substantially set equal to input timing of the normal row address signal to the normal row decoder and the normal column address signal to the normal column decoder in the normal mode.

According to a tenth aspect of the present invention, a semiconductor memory device comprises: a memory cell array including normal rows and normal columns in which normal memory cells are arranged, and at least one spare memory cell row and at least one spare memory cell column in which spare memory cells are arranged; and access means for accessing the spare memory cells arranged in the at least one spare memory cell row and the at least one spare memory cell column of the memory cell array for repairing a defect, wherein the same data are simultaneously written into a plurality of spare memory cells in a mode in which the spare memory cells are accessed.

An eleventh aspect of the present invention is intended for a method of checking a semiconductor memory device for a defect, the semiconductor memory device being switchable between a normal mode in which normal memory cells are read/written and a test mode in which the normal memory cells and spare memory cells provided for repairing a defect in the normal memory cells are tested, the semiconductor memory device comprising a memory cell array including normal rows and normal columns in which the normal memory cells are arranged and at least one spare memory cell row and at least one spare memory cell column in which the spare memory cells are arranged, a normal row decoder and a normal column decoder for accessing the normal memory cells, a spare row decoder for selecting the at least one spare memory cell row, and a spare column decoder for selecting the at least one spare memory cell column. According to the present invention, the method comprises the steps of: testing the normal memory cells; testing a spare memory cell selected by the normal row decoder and the spare column decoder; testing a spare memory cell selected by the normal column decoder and the spare row decoder; and testing a spare memory cell selected by the spare row decoder and the spare column decoder.

The semiconductor memory device in accordance with the first aspect of the present invention is designed so that at least one of the at least one spare memory cell row and the at least one spare memory cell column is put into the selected state with normal-mode timing without using the spare row decoder and the spare column decoder by using the address signal for addressing the memory cell array in the test mode. Thus, the address signal for use in the normal mode may be used for the test in the test mode without changing the conventional arrangement for reading and writing data from the normal memory cells and spare memory cells. Less portions are required to change in order to add the function of testing the spare memory cells.

In accordance with the semiconductor memory device of the second aspect of the present invention, the access means may access the third spare memory cell, reducing the number of failures of the semiconductor memory device which are generated when the defective normal memory cells are replaced with the spare memory cells.

The semiconductor memory device in accordance with the third aspect of the present invention does not necessitate the address signal provided specifically for the selection of addresses of the spare memory cells in the test mode to reduce the number of addresses specified by the address signal, reducing the circuit scale for input/output of the address signal in the normal mode.

The semiconductor memory device in accordance with the fourth aspect of the present invention may use the first and second test row decoders and the first and second test column decoders to test all memory cells in the memory cell array by the control means using the normal row address signal and the normal column address signal in the test mode. This reduces the number of addresses specified by the address signal provided from the exterior.

In accordance with the semiconductor memory device of the fifth aspect of the present invention, the converting means converts the normal row address signal and the normal column address signal to generate the test row address signal to be provided to the test row decoder and the test column address signal to be provided to the test column decoder. This reduces the number of addresses specified by the address signal provided from the exterior.

In accordance with the semiconductor memory device of the sixth aspect of the present invention, the additional address signal is added to the normal address signal when the address signal for selecting the first to third spare memory cells is generated. This reduces the number of addresses specified by the address signal provided from the exterior.

The semiconductor memory device in accordance with the seventh aspect of the present invention is set to the normal mode when the control signal is not inputted thereto, eliminating the need for setting to the normal mode when the semiconductor memory device is finished.

In accordance with the semiconductor memory device of the eighth aspect of the present invention, the access means is constructed to share the portion thereof having the arrangement similar to that of the normal row decoder with the normal row decoder and to share the portion thereof having the arrangement similar to that of the normal column decoder with the normal column decoder. This simplifies the arrangement.

In accordance with the semiconductor memory device of the ninth aspect of the present invention, the input of the address signal provided in the test mode to the access means is substantially timed to the input of the normal row address signal to be applied to the normal row decoder and the normal column address signal to be applied to the normal column decoder in the normal mode. The signal may be provided in a similar manner in the normal mode and test mode, and is easy to handle.

The semiconductor memory device in accordance with the tenth aspect of the present invention simultaneously writes the same data into the plurality of spare memory cells to prepare the test of the spare memory cells for a short time.

The method of checking a semiconductor memory device for a defect in accordance with the eleventh aspect of the present invention may test the spare memory cells selected by the spare row decoder and the spare column decoder, reducing the number of failures generated in the semiconductor memory device after the replacement.

It is therefore an object of the present invention to provide a semiconductor memory device which is capable of effectively repairing a defect in some of the memory cells arranged in a plurality of spare rows or columns. These and other objects, features, aspects and advantages of the present invention will become more apparent from the following detailed description of the present invention when taken in conjunction with the accompanying drawings.

BRIEF DESCRIPTION OF THE DRAWINGS

FIGS. 24A to 24D are a timing chart for illustrating the operation of the mode switching signal generating circuit of FIG. 23;

DESCRIPTION OF THE PREFERRED EMBODIMENTS

First Preferred Embodiment

Figure 1:
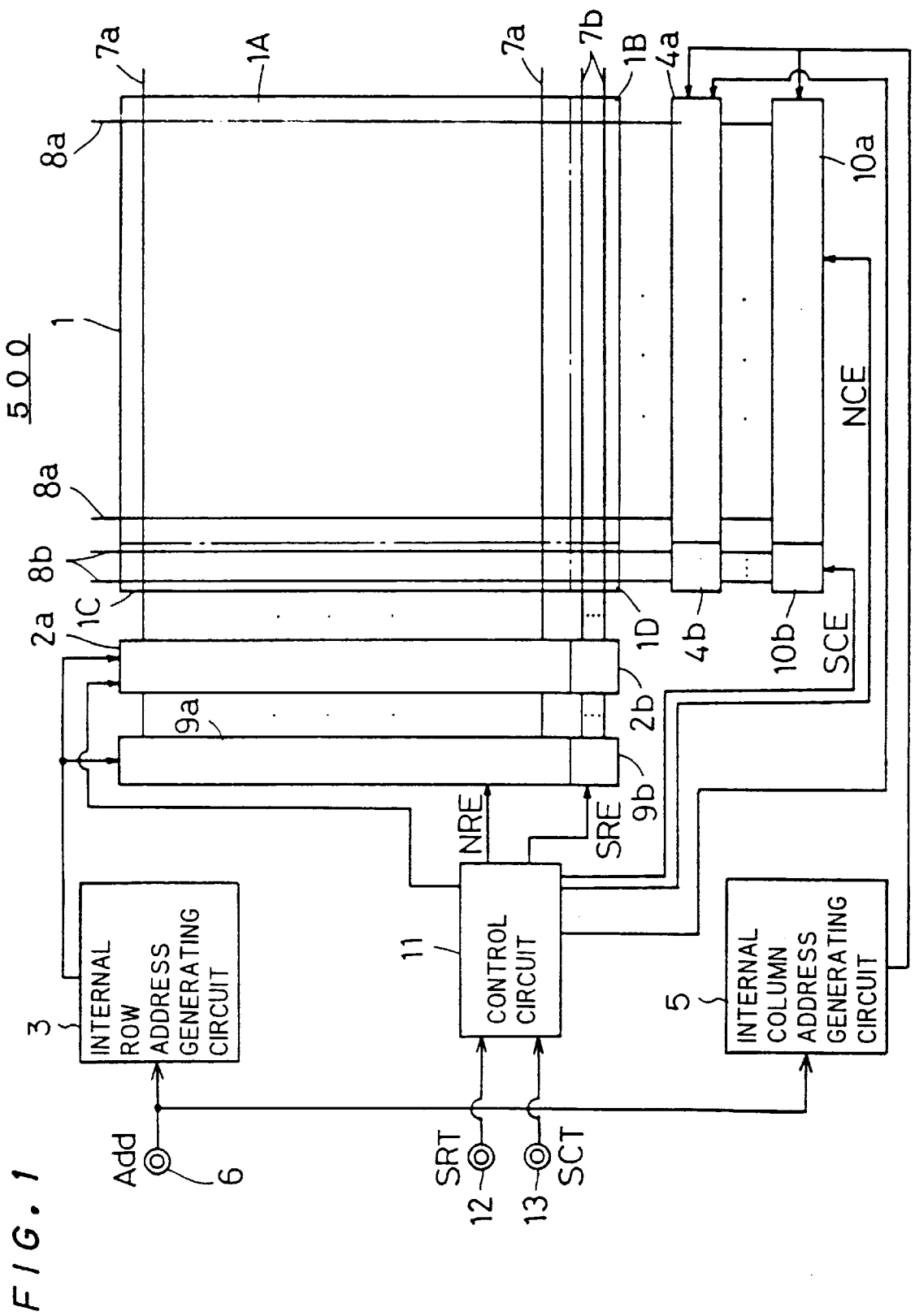
FIG. 1 block diagram of a semiconductor memory device according to a first preferred embodiment of the present invention.

A semiconductor memory device according to a first preferred embodiment of the present invention will now be described. FIG. 1 is a schematic block diagram of a DRAM according to a first preferred embodiment of the present invention. In FIG. 1, the reference numeral 1 designates a memory cell array comprising spare memory cells for repairing a defect; the reference character 2a designates a normal row decoder for specifying a row to be read or written with data among normal rows of the memory cell array 1; 2b designates a spare row decoder for specifying a spare memory cell row to be read or written with data among spare memory cell rows of the memory cell array 1 when a defect is repaired; 3 designates an internal row address generating circuit for generating a row address signal for specifying the row to be read or written in the memory cell array 1; 4a designates a normal column decoder for specifying a column to be read or written with data among normal columns of the memory cell array 1; 4b designates a spare column decoder for specifying a column to be read or written with data among spare memory cell columns of the memory cell array 1 when a defect is repaired; 5 designates an internal column address generating circuit for generating a column address signal for specifying the column to be written or read in the memory cell array 1; 6 designates an external address input terminal for receiving an address signal from the exterior of a DRAM 500; 7a designates word lines provided in the normal rows; 7b designates spare word lines provided in the spare memory cell rows; 8a designates bit lines provided in the normal columns; and 8b designates spare bit lines provided in the spare memory cell columns. In FIG. 1, only outermost ones of the multiplicity of word lines 7a, 7b and bit lines 8a, 8b are illustrated, with the remaining lines not shown.

The memory cell array 1 includes an area 1A wherein the normal memory cells selected by the normal row decoder 2a and the normal column decoder 4a are arranged, an area 1B wherein the spare memory cells selected by the spare row decoder 2b and the normal column decoder 4a are arranged, an area 1C wherein the spare memory cells selected by the normal row decoder 2a and the spare column decoder 4b are arranged, and an area 1D wherein the spare memory cells selected by the spare row decoder 2b and the spare column decoder 4b are arranged.

In a normal operation (also referred to as "a normal mode"), a memory cell in the memory cell array 1 is selected in the above described structure.

If the normal memory cells arranged in the area 1A are not defective, the DRAM selects a memory cell by using the normal row decoder 2a and the normal column decoder 4a.

If a normal memory cell is defective, setting is made so that the row or column in which the defective memory cell is positioned is not used, and the row or column is replaced with the spare memory cell row or spare memory cell column. Thus, both of the normal row decoder 2a and the spare row decoder 2b are used or both of the normal column decoder 4a and the spare column decoder 4b are used.

In FIG. 1, the reference character 9a designates a first test row decoder for selecting the normal row in a test mode wherein the memory cell array 1 is tested for a defect prior to defect reparation; 9b designates a second test row decoder for specifying the spare memory cell row in the test mode; 10a designates a first test column decoder for selecting the normal column in the test mode; 10b designates a second test column decoder for selecting the spare memory cell column in the test mode; 11 designates a control circuit for controlling the first and second test row decoders 9a and 9b and the first and second test column decoders 10a and 10b; 12 designates an input terminal for receiving a control signal SRT to be applied to the control circuit 11; and 13 designates an input terminal for receiving a control signal SCT to be applied to the control circuit 11.

An external address signal Add applied to the DRAM in the test mode has the same number of bits as that applied to the DRAM in the normal mode. However, the number of memory cells, the number of rows and the number of columns of the memory cell array 1 to be tested are greater by the number of spare memory cells, the number of spare memory cell rows, and the number of spare memory cell columns, respectively. Therefore, the area to be tested is divided into the four areas 1A to 1D which in turn are tested for different time periods, preventing the increase in types of the external address signal Add for test implementation.

The spare memory cells are tested by applying the signals SRT and SCT from the exterior to a test pad. As indicated in Table 1, these 2-bit control signals SRT and SCT permit switching between four conditions. A spare row area, a spare column area, and a cross point area which is the intersection of the spare row area and the spare column area are tested individually. In Table 1, the areas 1A to 1D of FIG. 1 to be tested individually are referred to as a normal cell area, a spare row area, a spare column area, and a cross point area, respectively.

TABLE 1

| access area | SRT | SCT | address |
|---|---|---|---|
| normal cell | open or 0 | open or 0 | RA0–RAn, CA0–CAm |
| spare row (SR0–SR3) | 1 | open or 0 | RA0–RA3, CA0–CAm |
| spare column (SC0–SC3) | open or 0 | 1 | RA0–RAn, CA0–CA3 |
| cross point | 1 | 1 | RA0–RA3, CA0–CA3 |

Figure 2:
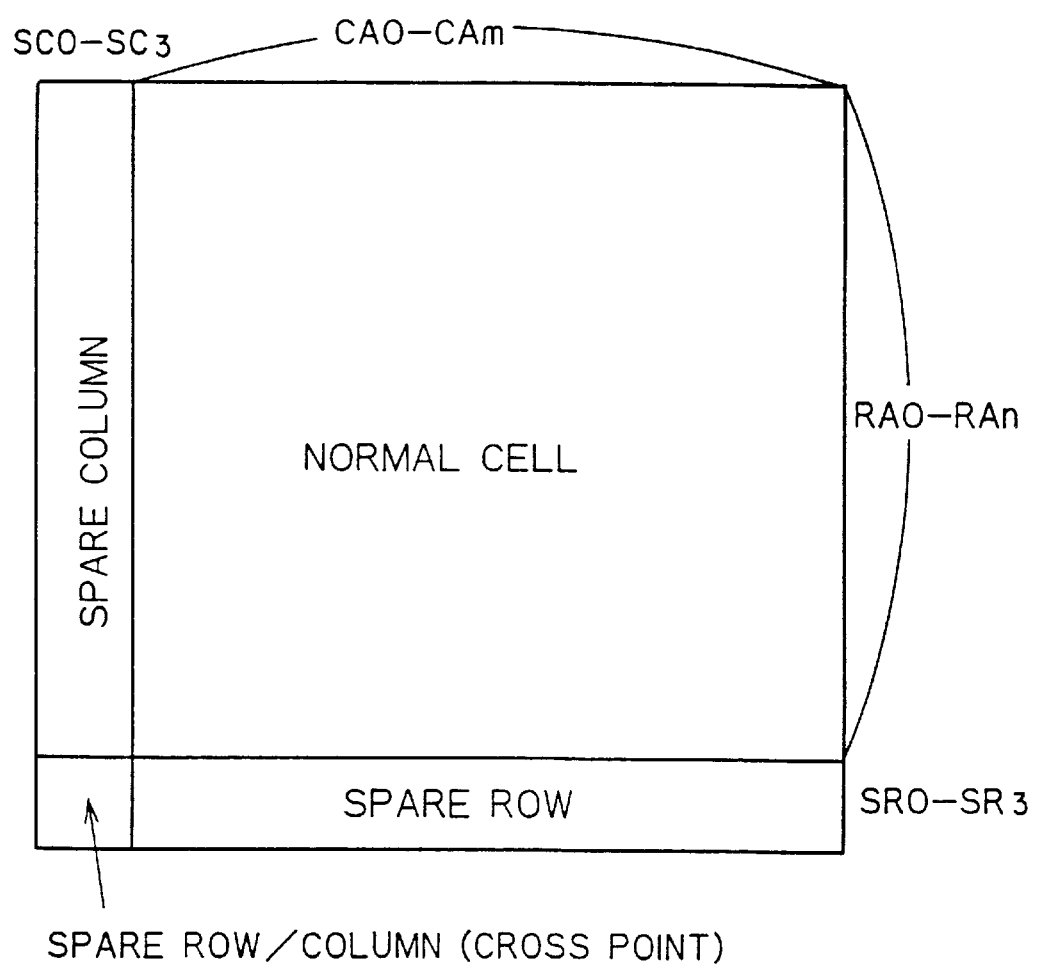
FIG. 2 conceptually illustrates addresses of a memory cell array shown in FIG. 1.

FIG. 2 conceptually illustrates the relation between addresses including normal row addresses RA0–RAn, normal column addresses CA0–CAm, spare row addresses SR0–SR3 and spare column addresses SC0–SC3, and the areas including the normal cell area, spare row area, spare column area and cross point area. Four spare memory cell rows and four spare memory cell columns are illustrated in FIG. 2.

The control circuit 11 may perform control so that signal NRE places the normal row decoder 2a into non-operation and a signal SRE places the test row decoder 9b into operation, permitting the selection of the memory cell in the spare column area by using, for example, the normal row addresses RA0–RA3 as the spare row addresses SR0–SR3, as indicated in Table 1.

Likewise, the control circuit 11 may perform control so that a signal NCE places the normal column decoder 4a into non-operation and a signal SCE places the test column decoder 10b into operation, permitting the selection of the memory cell in the spare column area by using, for example, the normal column addresses CA0–CA3 as the spare column addresses SC0–SC3, as indicated in Table 1.

(1) Testing the spare row area is as follows:

Input of SRT="1" puts the semiconductor memory device into the test mode. The row address signal outputted from the internal row address generating circuit 3 specifies the row addresses RA0–RA3 to select one of the four spare memory cell rows. Then, the column address signal outputted from the internal column address generating circuit 5 specifies the column addresses CA0–CAm to select one of the normal columns. In this manner, the second test row decoder 9b and the first test column decoder 10a specify the access address of the cell in the spare row area.

(2) Testing the spare column area is as follows:

Input of SCT="1" puts the semiconductor memory device into the test mode. The row address signal specifies the row addresses RA0–RAn to select one of the normal rows. The subsequently inputted column address signal specifies the column addresses CA0–CA3 to select one of the four spare memory cell columns. In this manner, the first test row decoder 9a and the second test column decoder 10b specify the access address of the cell in the spare column area.

(3) Testing the cross point area (spare row/column) is as follows:

Input of SRT="1" and SCT="1" puts the semiconductor memory device into the test mode. The row address signal specifies the row addresses RA0–RA3 to select one of the four spare memory cell rows. The subsequently inputted column address signal specifies the column addresses CA0–CA3 to select one of the four spare memory cell columns. In this manner, the second test row decoder 9b and the second test column decoder 10b specify the access address of the cell at the intersection of the four spare memory cell rows and four spare memory cell columns.

In this fashion, the row address signal generated from the internal row address generating circuit 3 and the column address signal generated from the internal column address generating circuit 5 on the basis of the external address signal from address pins (external address input terminal 6) for normal use may readily address the memory cell in the spare area in the conventional manner, permitting access to the addressed spare memory cell without a hitch.

It is a common practice that semiconductor memory devices such as a DRAM comprise redundant memory cells to repair defective bits for the purpose of yield enhancement. The semiconductor memory device of the first preferred embodiment, however, may find whether or not the redundancy memory cells are defective prior to the defect reparation, and does not use the spare row or spare column containing a defect for defect reparation to prevent failed defect reparation resulting from the failure of the semiconductor memory device because of the presence of a defect in the spare row memory cell or spare column memory cell in spite of the defect having been repaired using the spare row or spare column, enhancing the success rate of defect reparation.

If no signal is applied to the test pads SRT and SCT (in the case of input floating), the semiconductor memory device is constructed to enter the normal mode in which normal access is performed. Such a construction permits the normal mode operation without a hitch after packaging.

Figure 3:
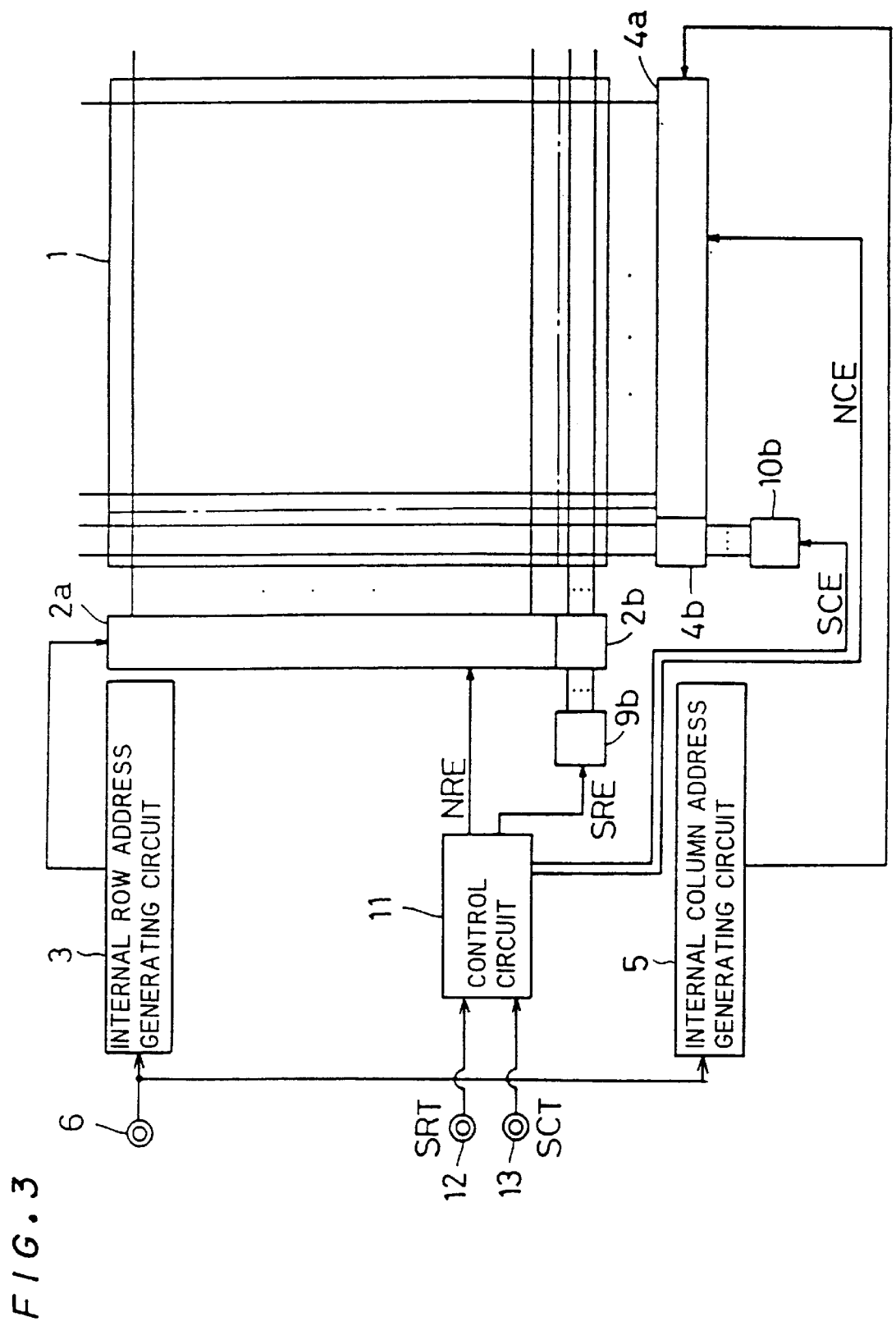
FIG. 3 is a block diagram of the semiconductor memory device of another form according to the first preferred embodiment of the present invention.

Additionally, since the first test row decoder 9a and normal row decoder 2a shown in FIG. 1 are substantially of the same construction, one row decoder may be shared as the first test row decoder and normal row decoder as illustrated in FIG. 3. The same is true for the first test column decoder 10a and the normal column decoder 4a.

Figure 4:
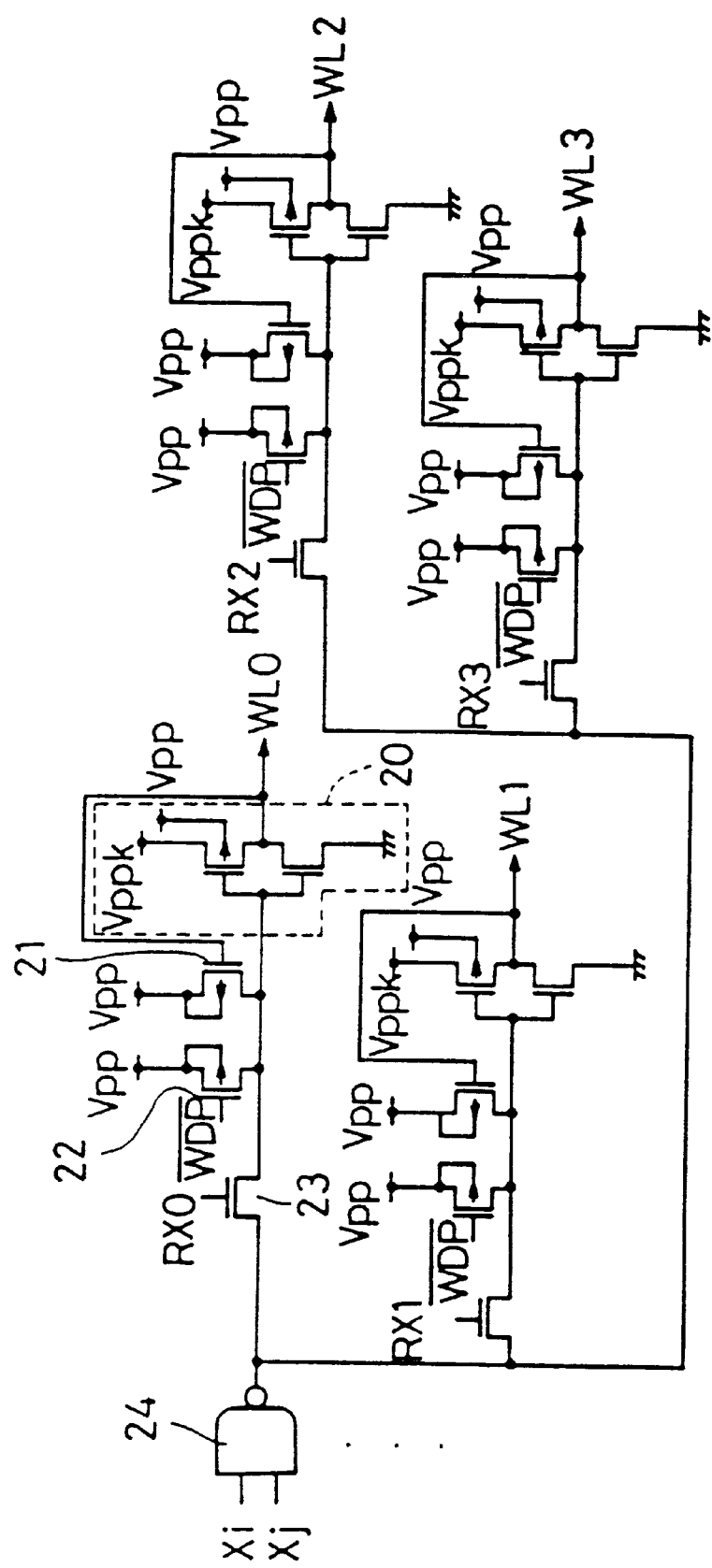
FIGS. 4 to 6 are fragmentary circuit diagrams of a normal row decoder according to the present invention.
Figure 5:
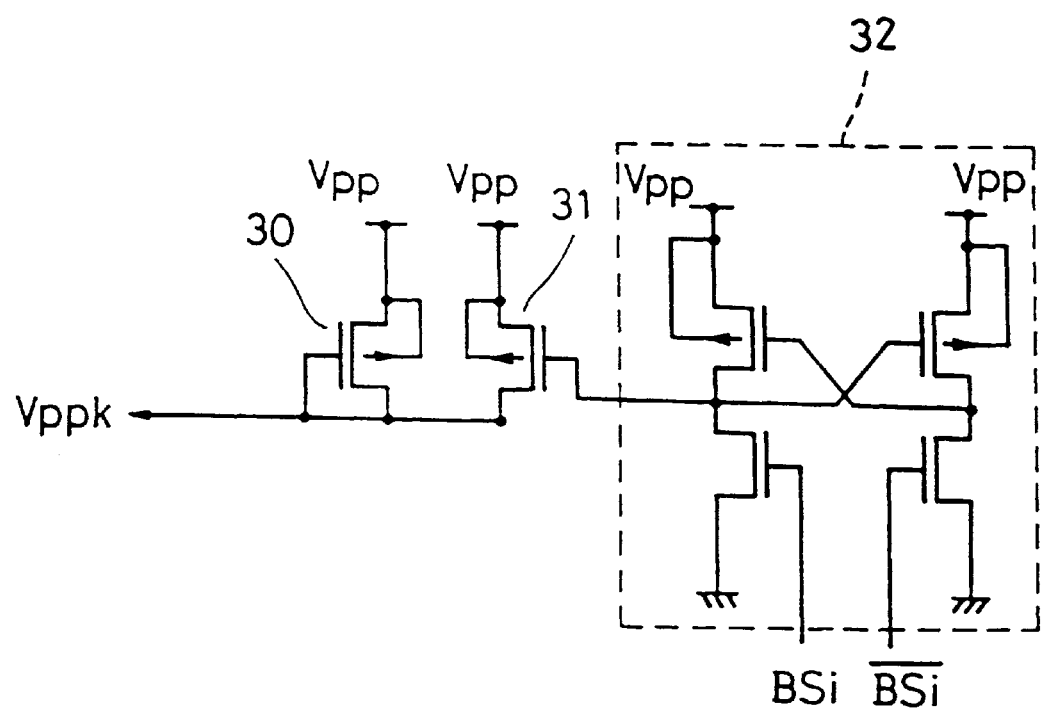
Figure 6:
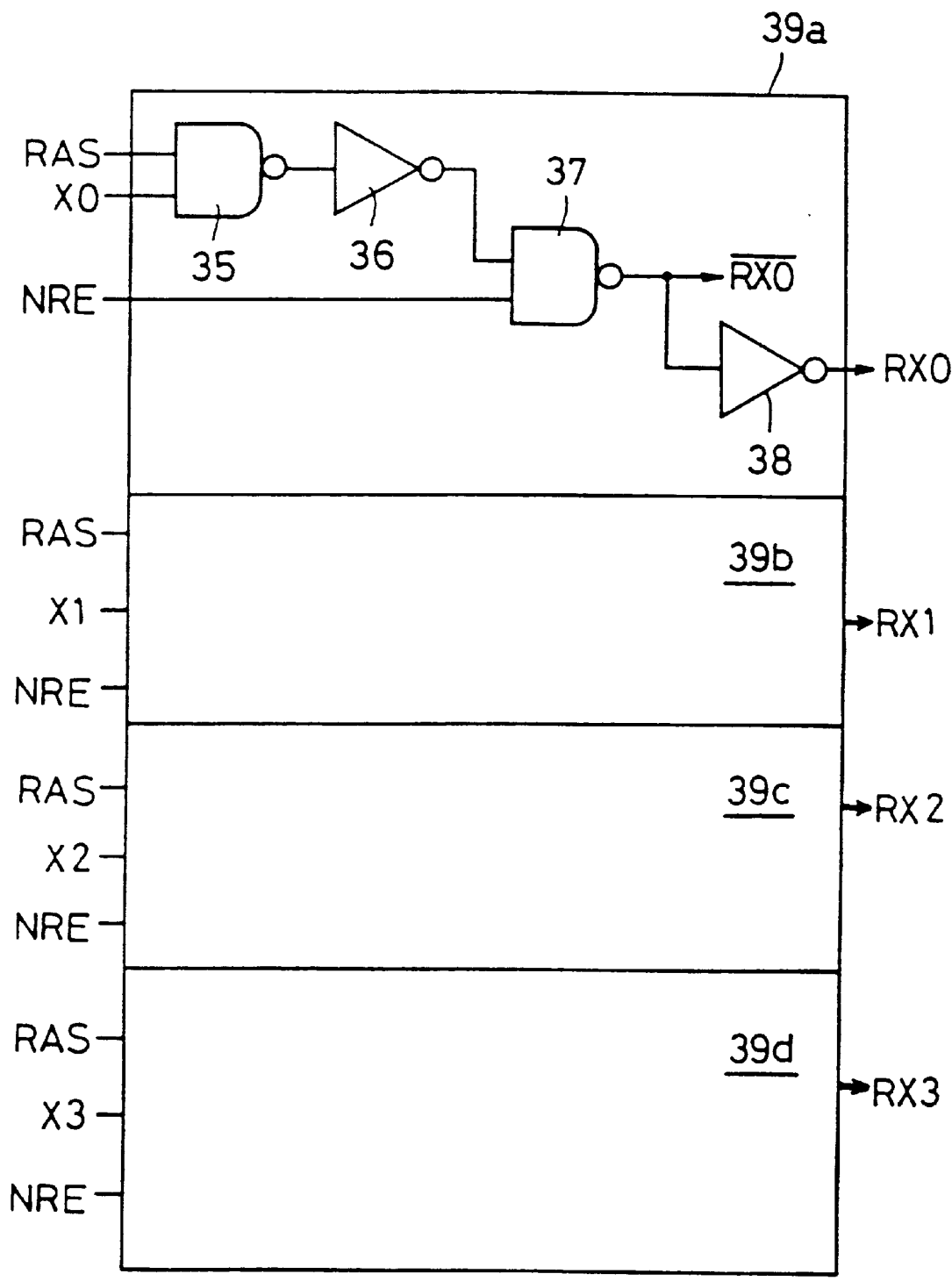

The structure of a DRAM shown in FIG. 3 is described in detail below. FIGS. 4, 5 and 6 are circuit diagrams of the normal row decoder 2a depicted in FIG. 3. In FIG. 4, the reference numeral 20 designates a word driver for activating a word line WL0; 21 designates a P-channel MOS transistor having a gate connected to the word line WL0, a source receiving a boosted power supply voltage Vpp, and a drain connected to the input of the word driver 20 for holding the output from the word driver 20; 22 designates a P-channel MOS transistor having a drain connected to the input of the word driver 20, a source receiving the power supply voltage Vpp, and a gate receiving a signal $\overline{WDP}$ for precharging the word driver 20; 23 designates a gate having a terminal receiving a signal RX0 for final decoding; and 24 designates an AND gate for receiving pre-decoded internal row address signals Xi and Xj. Four word lines WL0 to WL3 have a probability of being selected by the output from the AND gate 24. The word lines WL1 to WL3 are selected by signals RX1 to RX3, respectively. The circuit arrangement for driving the word lines WL1 to WL3 is similar to that for driving the word line WL0, and the description of the circuit arrangement is dispensed with. The number of circuits each having the arrangement of FIG. 4 which is required to construct a row decoder is equivalent to a quarter of the number of entire word lines, but the repetition of the same circuit arrangement is not shown in FIG. 4.

FIG. 5 is a circuit diagram of a voltage supply circuit for outputting a voltage Vppk to be applied to the word driver. In FIG. 5, the reference numeral 30 designates a P-channel MOS transistor for clamping the voltage Vppk; 31 designates a P-channel MOS transistor for pulling the voltage Vppk up to the voltage Vpp in accordance with a control signal at its gate; and 32 designates a control signal generating circuit for applying a control signal responsive to block selection signals BSi and $\overline{BSi}$ to the gate of the P-channel MOS transistor 31.

Figure 30:
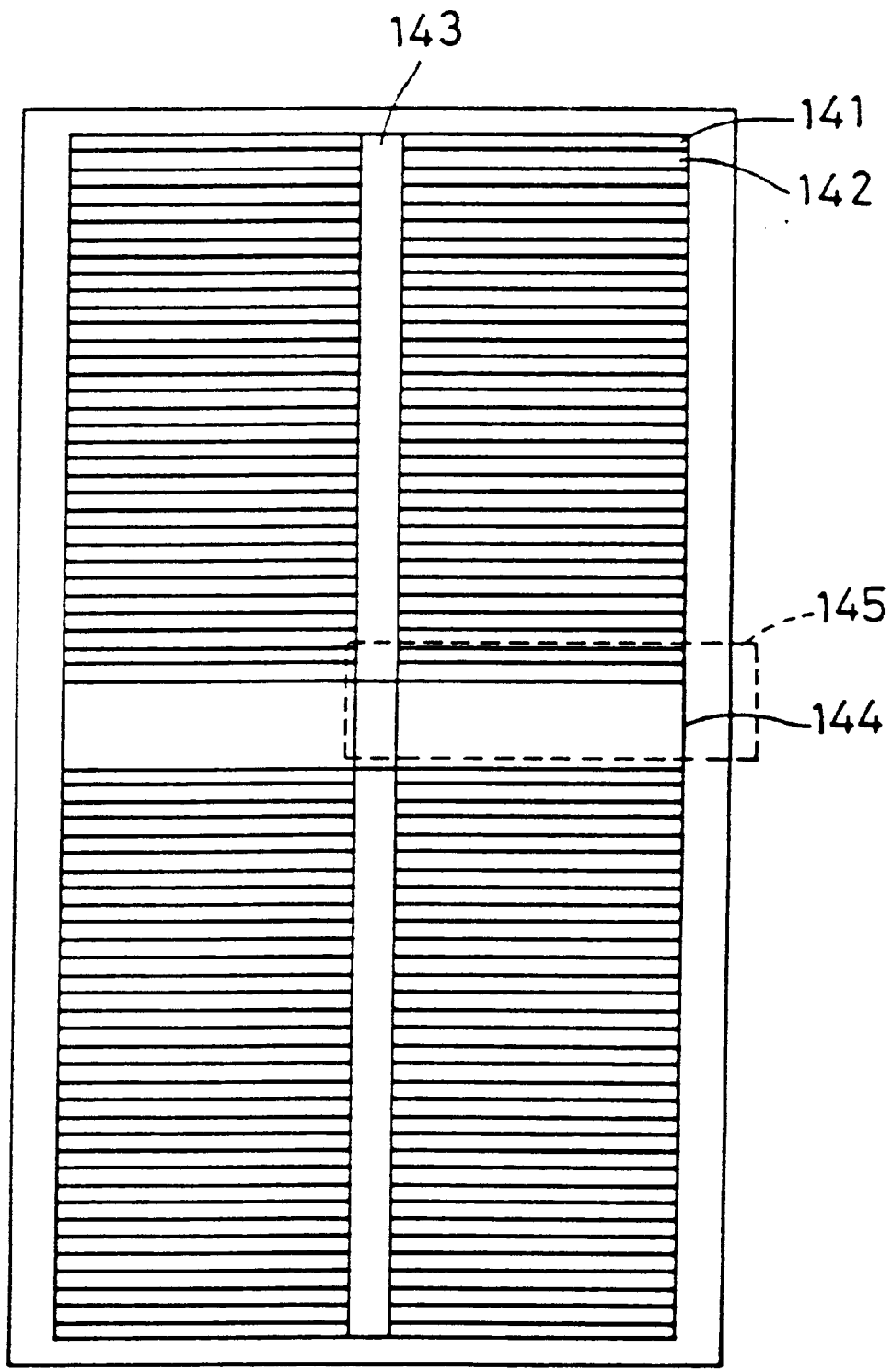
FIG. 30 is a fragmentary plan view of a conventional semiconductor memory device.
Figure 31:
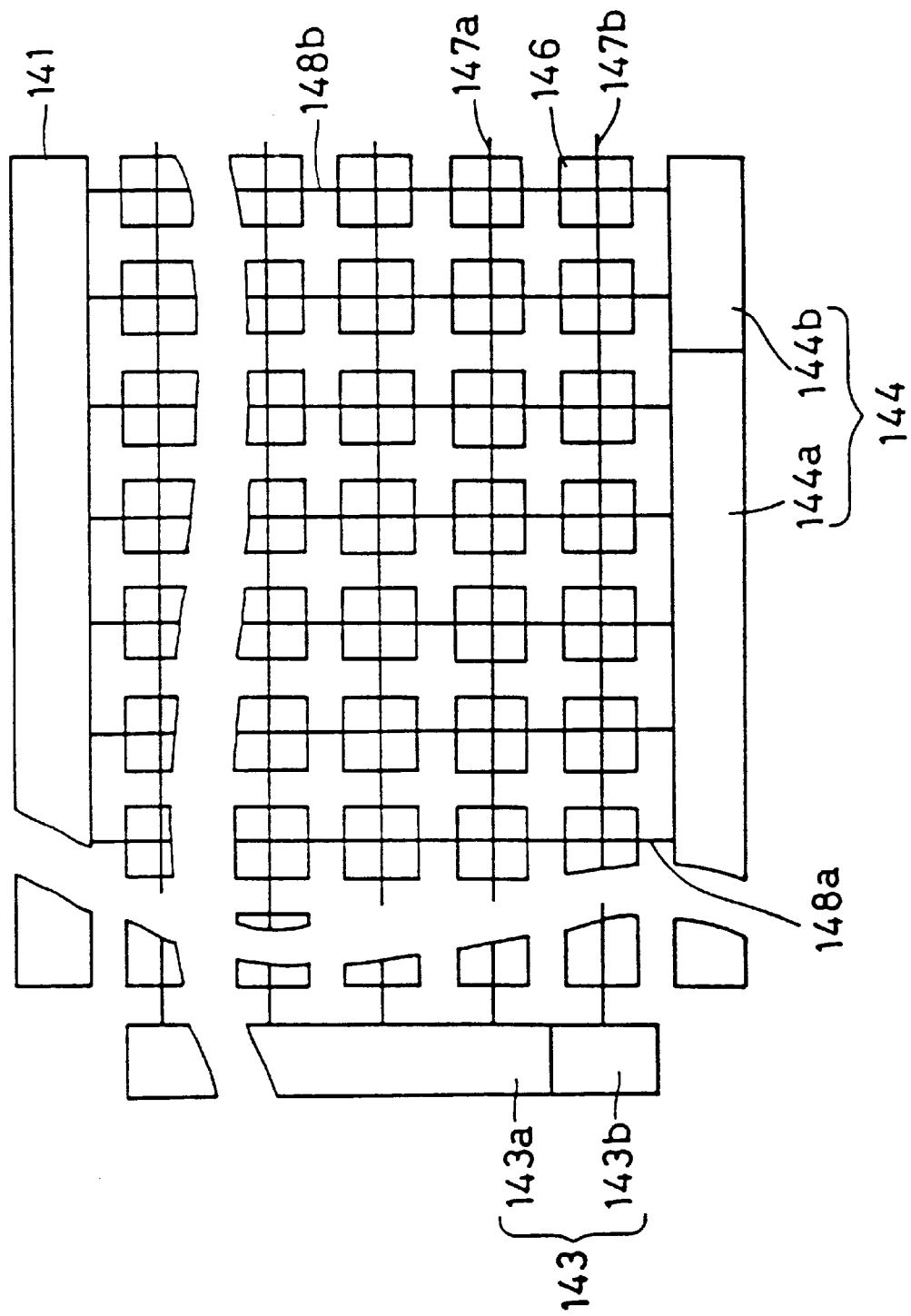
FIG. 31 conceptually illustrates peripheral portions of a memory cell array shown in FIG. 30.
Figure 32:
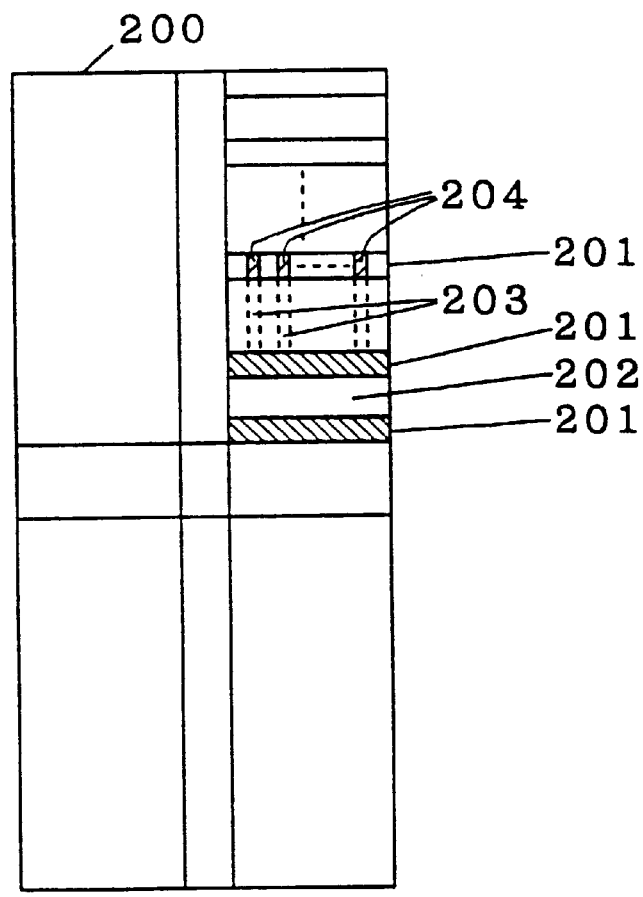
FIG. 32 is a plan view of a conventional dynamic semiconductor memory device.
Figure 33:
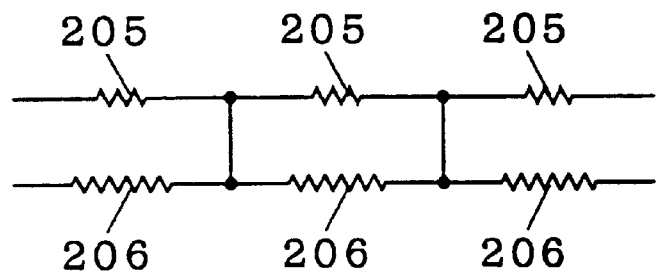
FIG. 33 conceptually illustrates word line backing areas shown in FIG. 32.
Figure 34:
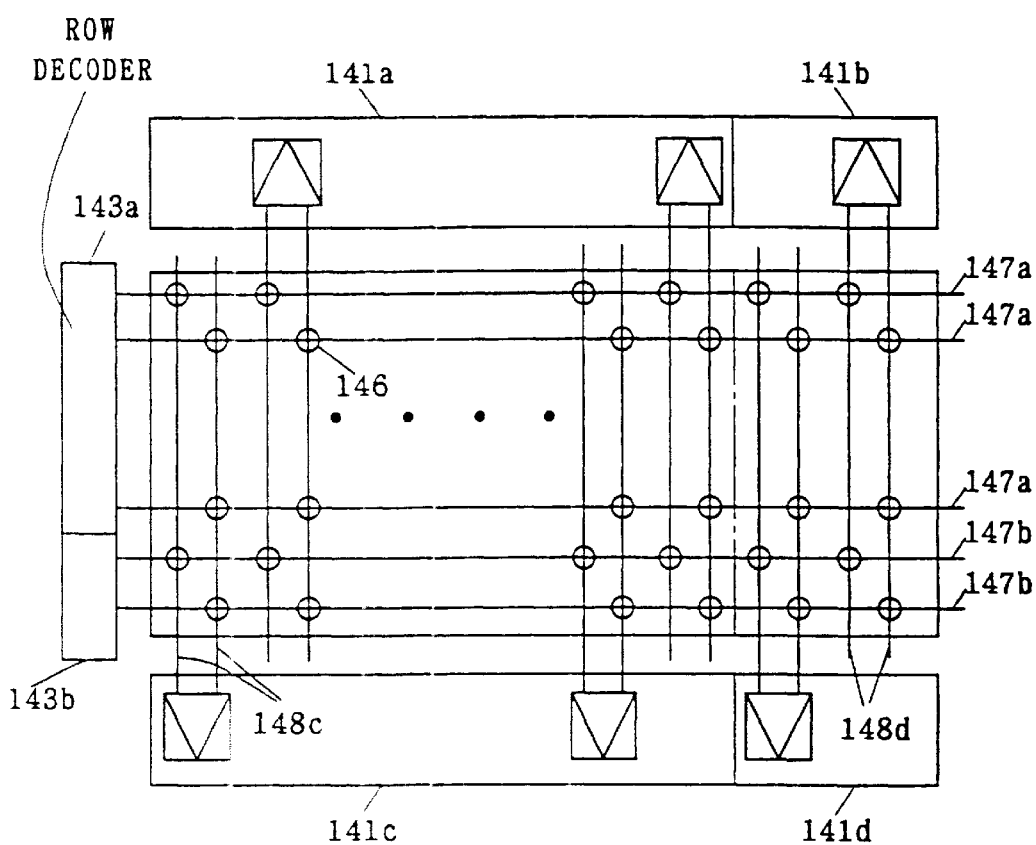
FIG. 34 is a block diagram of a memory cell block of the dynamic semiconductor memory device.

The structure illustrated in FIG. 5 is provided so that when the memory cell array is divided into a plurality of blocks, for example, those corresponding to the memory cell arrays 142 shown in FIG. 30, the operation may be controlled for each block for reduction in power consumption.

FIG. 6 is a circuit diagram of a signal generating circuit for generating signals RX0 to RX3 to be applied to the decoder shown in FIG. 4. In FIG. 6, the reference numeral 35 designates a NAND gate for outputting the NAND of a row address strobe signal RAS and a bit X0 constituting the internal row address signal; 36 designates a NOT gate for outputting the NOT of the output from the NAND gate 35; 37 designates a NAND gate for outputting the NAND of the output from the NOT gate 36 and the normal row enable signal NRE; 38 designates a NOT gate for outputting the NOT of the output from the NAND gate 37; the reference character 39a designates a circuit portion comprised of the NAND gates 35, 37 and the NOT gates 36, 38 for generating the signal RX0 on the basis of the row address strobe signal RAS, the normal row enable signal NRE and the pre-decoded internal address signal X0; and 39b to 39d designate circuit portions having a construction similar to that of the circuit portion 39a for generating the signals RX1 to RX3, respectively, on the basis of the row address strobe signal RAS, the normal row enable signal NRE, and the internal address signals X1 to X3.

Figure 7:
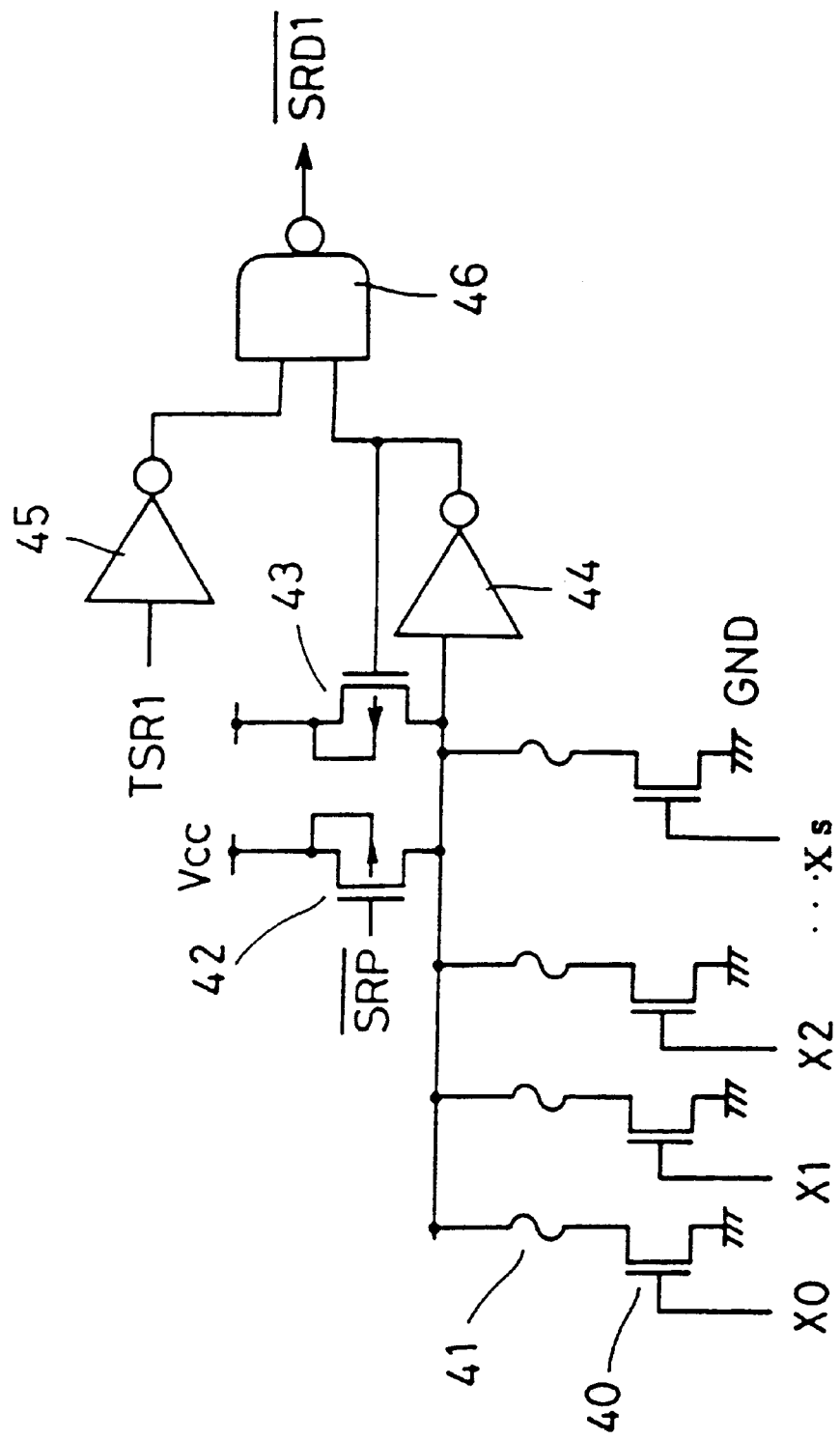
FIG. 7 is a circuit diagram of a spare row decoder according to the first preferred embodiment of the present invention.

FIG. 7 is a circuit diagram of the spare row decoder 2b as shown in FIG. 3. In FIG. 7, the reference numeral 40 designates N-channel MOS transistors having gates respectively receiving the pre-decoded internal row address signals X0 to Xs for constituting an OR gate for judging whether to activate the word line or not by using the internal row address signal; 41 designates fuses connected respectively to the drains of the N-channel MOS transistors 40 for programming a desired combination of addresses; 42 designates a P-channel MOS transistor having a gate receiving a signal $\overline{SRP}$ for precharging, a source receiving a power supply voltage Vcc, and a drain connected to the fuses 41; 44 designates a NOT gate having an input terminal connected to the drain of the P-channel MOS transistor 42, and an output terminal; 43 designates a P-channel MOS transistor having a gate connected to the output terminal of the NOT gate 44, a source receiving the power supply voltage Vcc, and a drain connected to the input terminal of the NOT gate 44; 45 designates a NOT gate for inverting a signal TSR1 to output the inverted signal; and 46 designates a NAND gate for outputting the NAND of the outputs from the NOT gates 44 and 45.

The output from the NAND gate 46 is a signal $\overline{SRD1}$.

The signal TSR1 has been used in the conventional row decoder for switching between the operation and non-operation of the spare row decoder in the normal operation. In the test mode, the signal TSR1 is used to control the operation of the spare row decoder 2b. In the test mode, the spare row decoder 2b functions to inactivate the word line SWL0 prior to reparation independently of which one of the pre-decoded row address signals X0 to Xs may be high. Thus, the signal $\overline{SRD1}$ is controlled, in the test mode, so that the signal TSR1 selectively places the spare row decoder 2b into operation.

Although not shown, the spare row decoder includes three additional circuits having an arrangement similar to that of FIG. 7 and corresponding to signals TSR1 to TSR4.

Figure 8:
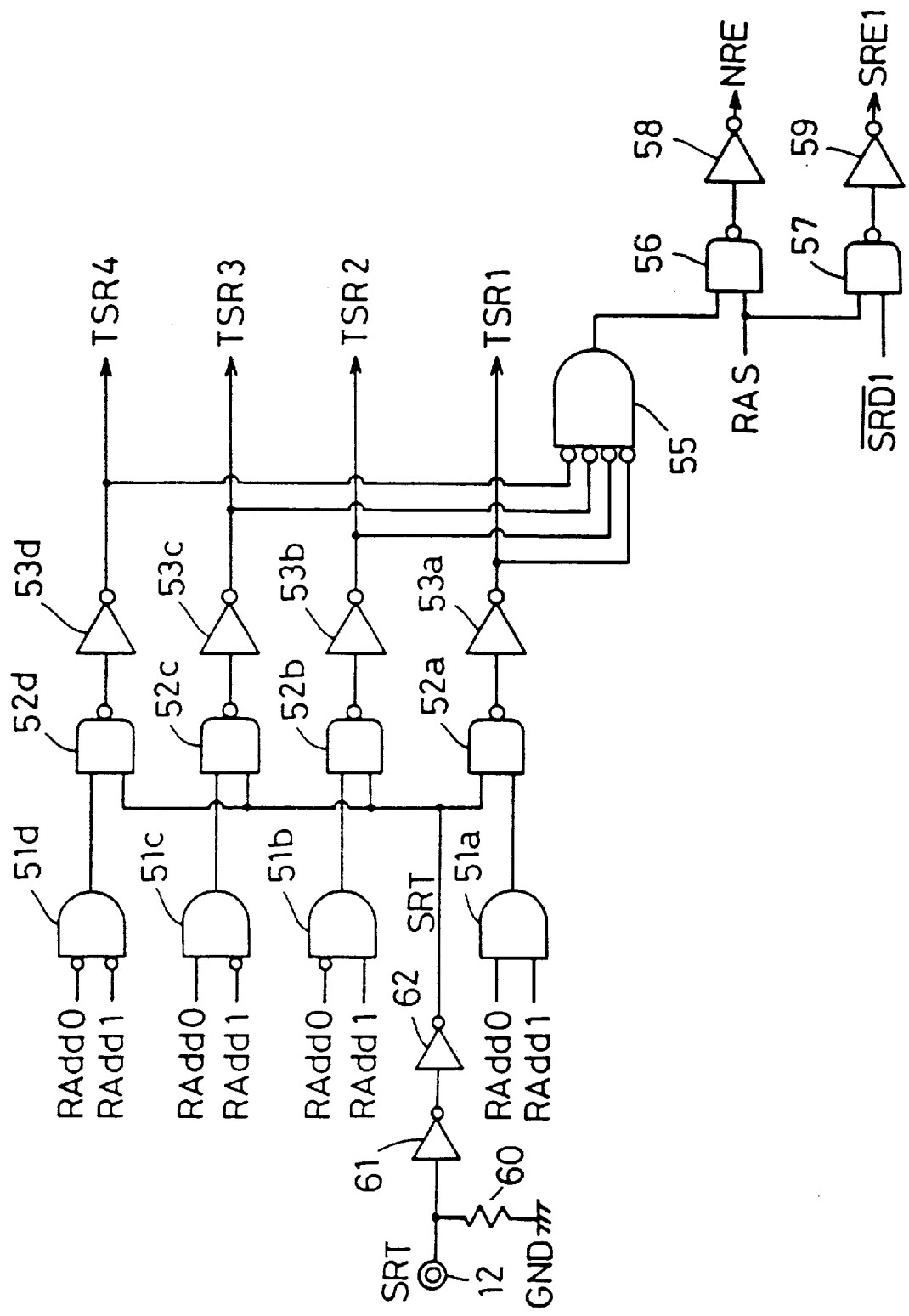
FIG. 8 is a fragmentary circuit diagram of a control circuit according to the first preferred embodiment of the present invention.

FIG. 8 is a logic diagram of portions of the control circuit which are associated with the row decoder. In FIG. 8, the reference characters 51a to 51d designate gates for decoding internal address signals RAdd0 and RAdd1; 52a to 52d designate NAND gates having first inputs receiving the outputs from the gates 51a to 51d, respectively, and second inputs receiving the signal SRT for outputting the NAND of the first and second inputs thereof; 53a to 53d designate NOT gates for negating the outputs from the NAND gates 52a to 52d for outputting signals TSR1 to TSR4, respectively; 55 designates a NOR gate for receiving the outputs from the NOT gates 53a to 53d for outputting the NOR of the signals TSR1 to TSR4; 56 designates a NAND gate for outputting the NAND of the output from the NOR gate 55 and the signal RAS; 58 designates a NOT gate for negating the output from the NAND gate 56 to output the signal NRE; 57 designates a NAND gate for outputting the NAND of the signal SRD1 and the signal RAS; and 59 designates a NOT gate for negating the output from the NAND gate 57 to generate and output a signal SRE1.

Figure 9:
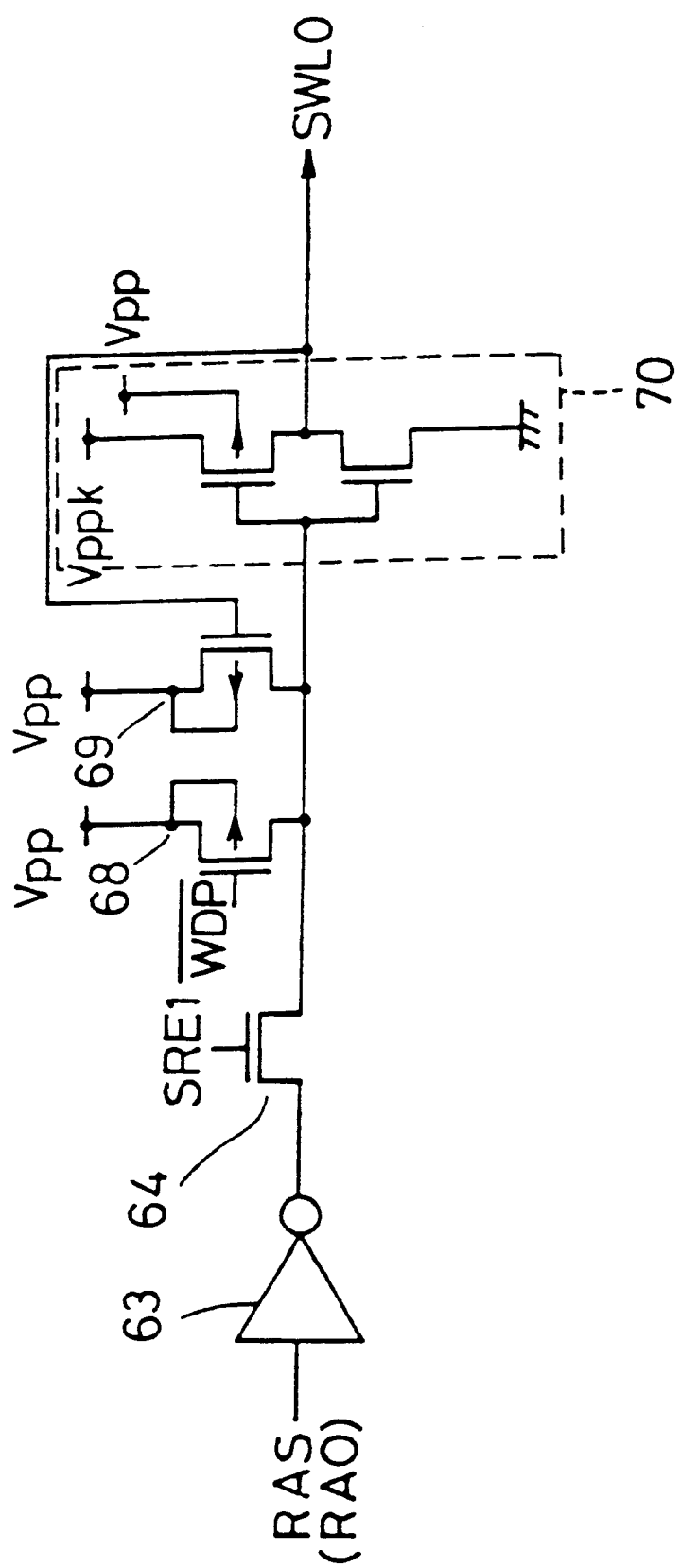
FIG. 9 is a circuit diagram of the spare row decoder according to the first preferred embodiment of the present invention.

FIG. 9 is a circuit diagram of the second test row decoder 9b for selectively driving the word line. In FIG. 9, the reference numeral 63 designates a NOT gate having an input terminal receiving the signal RAS (or the internal address signal RA0) and an output terminal for outputting the inverted signal $\overline{RAS}$; 64 designates a transfer gate having a first end connected to the output terminal of the NOT gate 63, a gate receiving the signal SRE1, and a second end for selectively outputting the signal at its first input; 68 designates a P-channel MOS transistor having a drain connected to the second end of the transfer gate 64, a gate receiving the signal $\overline{WDP}$, and a source receiving the voltage Vpp, and established so that a substrate potential equals the source potential; 69 designates a P-channel MOS transistor having a drain connected to the second end of the transfer gate 64, a gate connected to the word line SWL0, and a source receiving the voltage Vpp; and 70 designates a word driver having an input terminal connected to the second end of the transfer gate 64, and an output terminal connected to the word line SWL0.

The semiconductor memory device of the first preferred embodiment is provided with four word lines designated at SWL0 to SWL3, and the circuits for driving the word lines SWL0 to SWL3 are of the same construction. Then, only the circuit for selectively driving the word line SWL0 is illustrated.

Figure 10:
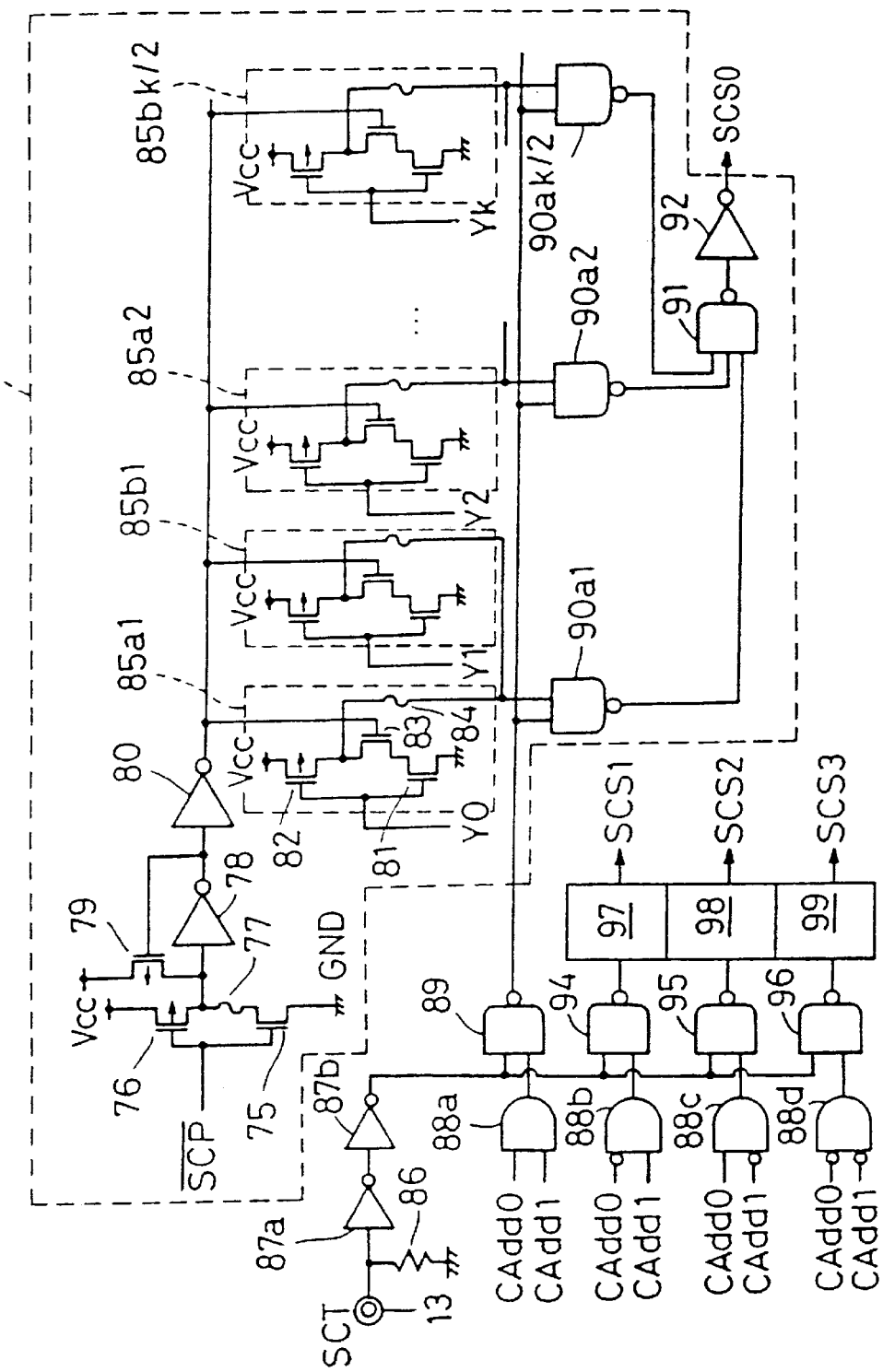
FIG. 10 is a fragmentary circuit diagram of the control circuit according to the first preferred embodiment of the present invention.

The selection of the column address is described with reference to FIGS. 10 and 11. In FIG. 10, the reference numeral 75 designates an N-channel MOS transistor having a source grounded, a gate receiving a signal $\overline{SCP}$, and a drain for drawing current in response to the signal $\overline{SCP}$, 76 designates a P-channel MOS transistor having a source receiving the lower supply voltage Vcc, a gate receiving the signal $\overline{SCP}$, and a drain for supplying current in response to the signal $\overline{SCP}$, and for precharging; 77 designates a fuse connected between the N-channel MOS transistor 75 and the P-channel MOS transistor 76; 78 designates a NOT gate having an input terminal connected to the drain of the P-channel MOS transistor 76, and an output terminal for outputting the NOT of the signal at its input terminal; 79 designates a P-channel MOS transistor having a gate connected to the output terminal of the NOT gate 78, a drain connected to the input terminal of the NOT gate 78, and a source receiving the power supply voltage Vcc; and 80 designates a NOT gate having an input terminal connected to the output terminal of the NOT gate 78, and an output terminal for outputting the NOT of the signal at its input terminal.

The NOT gates 78 and 80, and the P-channel MOS transistor 79 constitute a latch circuit.

With continued reference to FIG. 10, the reference numeral 81 designates an N-channel MOS transistor having a source grounded a gate receiving a signal Y0, and a drain for outputting the ground voltage in response to the column address signal Y0; 82 designates a P-channel MOS transistor having a source receiving the power supply voltage Vcc, a gate receiving the column address signal Y0, and a drain for outputting the power supply voltage Vcc in response to the signal Y0; 83 designates an N-channel MOS transistor having a source connected to the drain of the N-channel MOS transistor 81, a drain connected to the drain of the P-channel MOS transistor 82, and a gate connected to the output terminal of the NOT gate 80; and 84 designates a fuse having a first end connected to the drain of the P-channel MOS transistor 82, and a second end electrically connected to the first end thereof, if not burnt.

The reference character 85a1 designates a coincidence detecting portion including the N-channel MOS transistors 81, 83, the P-channel MOS transistor 82, and the fuse 84; and 85b1 to 85bk/2 designate coincidence detecting portions having a construction similar to that of the coincidence detecting portion 85a1 for detecting the coincidence of the logic of the column address signals Y1 to Yk, respectively. The outputs from the coincidence detecting portions 85a1 to 85bk/2 are set so that precedence is given to a high level output In FIG. 10, the reference numeral 86 designates a resistor having a first end grounded, and a second end connected to the input terminal 13; the reference character 87a designates a NOT gate having an input terminal connected to the second end of the resistor 86, and an output terminal for outputting the NOT of the signal at its input terminal; 87b designates a NOT gate having an input terminal connected to the output terminal of the NOT gate 87a, and an output terminal for outputting the NOT of the output from the NOT gate 87a at its input terminal; 89 designates a NAND gate having a first input terminal connected to the output terminal of the NOT gate 87b, a second input terminal connected to the output terminal of an AND gate 88a receiving external column address signals CAdd0 and CAdd1, and an output terminal for outputting the NAND of the output from the NOT gate 87b and the output from the AND gate 88a; 90a1 designates a NAND gate for outputting the NAND of the output from the NAND gate 89 and the logical sum of the outputs from the coincidence detecting portions 85a1 and 85b1; 90a2 to 90ak/2 designate NAND gates for outputting the NAND of the output from the NAND gate 89 and the logical sum of the outputs from the two coincidence detecting portions connected at their input terminal; 91 designates a NAND gate for outputting the NAND of the outputs from the NAND gates 90a1 to 90ak/2; and 92 designates a NOT gate for generating the NOT of the output from the NAND gate 91.

The output from the NOT gate 92 is a signal SCS0. The reference numeral 93 designates a decoder portion for selection of the spare memory cell column. The decoder portion 93 may burn the fuses provided in the coincidence detecting portions 85a1 to 85bk/2 to set the address of the spare memory cell column to be substituted for the normal column.

The reference numerals 94 to 96 designate NAND gates for outputting the NAND of the output from the NOT gate 87b and the output from the gate 88b, the NAND of the output from the NOT gate 87b and the output from the gate 88c, and the NAND of the output from the NOT gate 87b and the output from the gate 88d, respectively; and 97 to 99 designate decoder portions for generating signals SCS1 to SCS3 on the basis of the outputs from the NAND gates 94 to 96 to output the signals SCS1 to SCS3, respectively.

Figure 11:
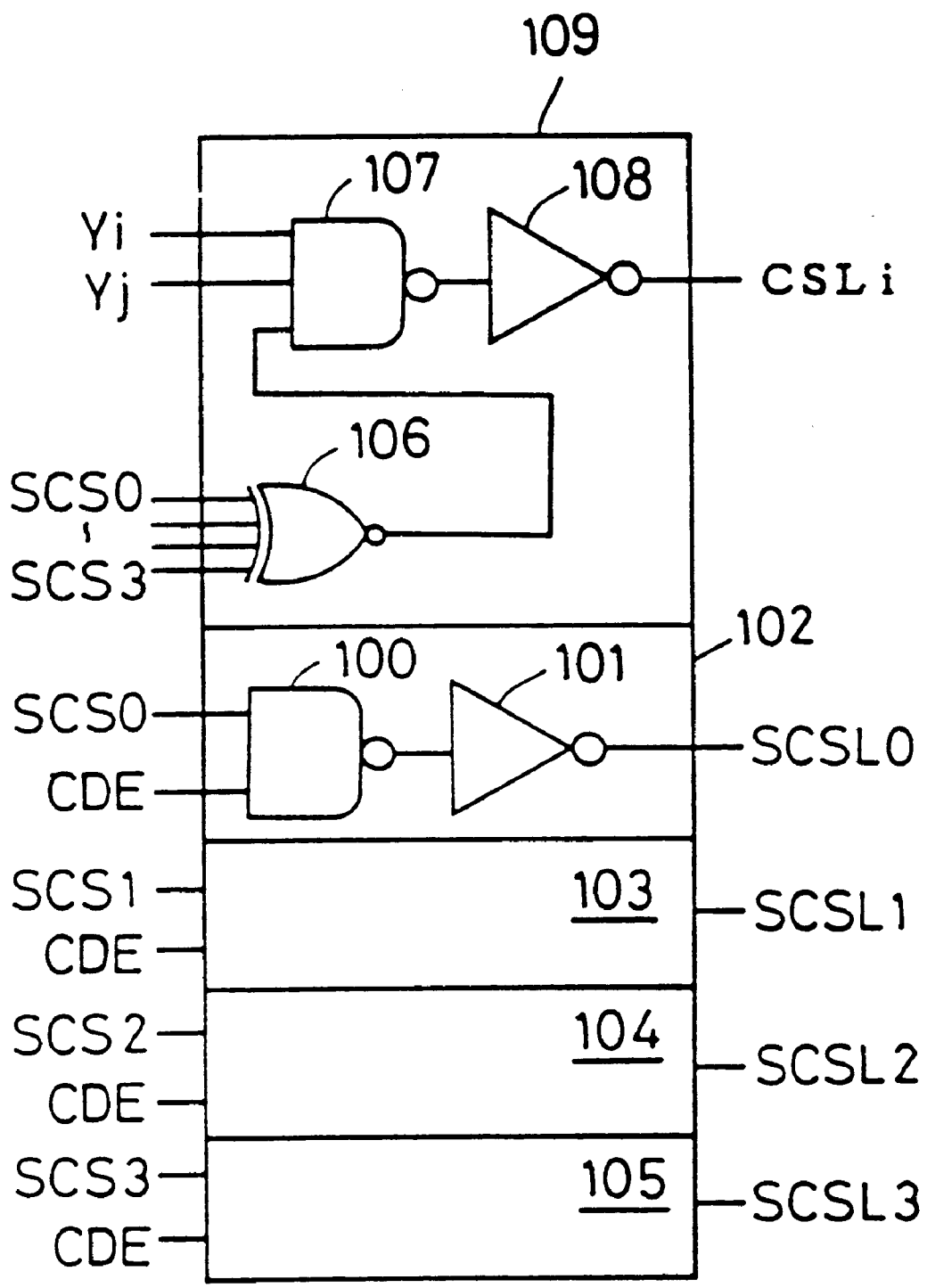
FIG. 11 is a diagram of normal and spare column decoders according to the first preferred embodiment of the present invention.

In FIG. 11, the reference numeral 100 designates a NAND gate for outputting the NAND of the signal SCS0 and a signal CDE; and 101 designates a NOT gate for generating the NOT of the output from the NAND gate 100. The output from the NOT gate 101 is a signal SCSL0 for selectively activating the bit line of the spare memory cell column. Signal generating circuits 103 to 105 are similar in construction to a signal generating circuit 102 comprised of the NAND gate 100 and the NOT gate 101 and generate signals SCSL1 to SCSL3 on the basis of the signals SCS1 to SCS3 and the signal CDE, respectively.

In FIG. 11, the reference numeral 106 designates an exclusive-NOR gate for receiving the signals SCS0 to SCS3 to output "1" only when these signals coincide; 107 designates a NAND gate for outputting the NAND of the column address signals Yi, Yj and the output from the exclusive-NOR gate 106; 108 designates a NOT gate for outputting the NOT of the output from the NAND gate 107; and 109 designates a normal column decoder comprised of the exclusive-NOR gate 106, the NAND gate 107, and the NOT gate 108 for outputting a column selection signal CSLi for activating the bit line.

Figure 12:
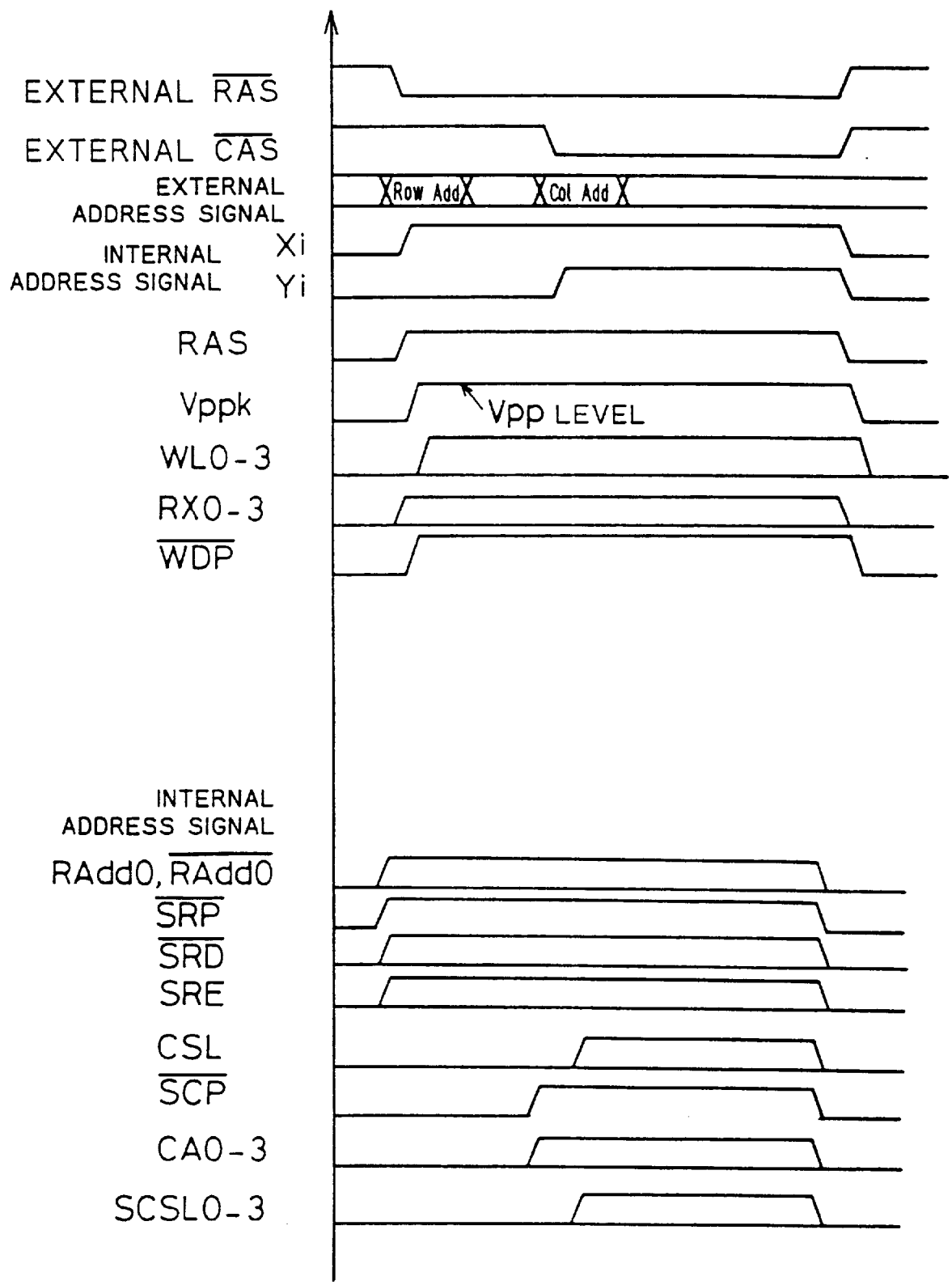
FIG. 12 is a timing chart showing the operation of the semiconductor memory device according to the first preferred embodiment of the present invention.

The operation of the semiconductor memory device of the first preferred embodiment will be briefly described with reference to FIG. 12. The row address is specified after the external row address strobe signal $\overline{RAS}$ falls, and the column address is specified after an external column address strobe signal $\overline{CAS}$ falls. When the signal $\overline{RAS}$ rises, the signal $\overline{WDP}$ for precharging the word driver and the signal SRP for precharging the input terminal of the NOT gate 44 of the spare row decoder for selection of the spare memory cell row rise.

In the normal mode, the signal SRT and the signal SCT are low. Then, the resistor 60 causes the input terminal of the NOT gate 61 to be set at the ground voltage GND, and the output from the NOT gate 62 is low. Thus, the outputs from the NAND gates 52a to 52d are constantly high independently of the internal address signals RAdd0 and RAdd1, causing the outputs from the NOT gates 53a to 53d to be constantly low. Since the inputs of the gate 55 are all low, the gate 55 outputs the high level signal. Therefore, the NAND gate 56 outputs the negation of the signal RAS, and the output waveform of the NOT gate 58, that is, the signal NRE is similar to the waveform of the signal RAS. Then, in the normal row decoder 2a shown in FIG. 3, the NAND gate 37 in the circuit portion 39a, for example, outputs the negation of the NOT gate 36, and one of the signals RX0 to RX3 outputted from the circuit portions 39a to 39d is high. The word lines WL0 to WL3 connected to the transfer gate receiving the signals RX0 to RX3 which are high are activated among the word lines connected to the NAND gates 24 for decoding the internal address signals Xi and Xj to output the low level signal.

In the spare row decoder 2b in the normal mode, since the signal TSR1 outputted from the NOT gate 53 is fixed at the low level, the output from the NOT gate 45 is constantly high, and the NAND gate 46 outputs the negation of the output from the NOT gate 44. Thus, if one of the fuses 41 is burnt, the spare row decoder 2b outputs the signal for selection of the word line by using the address corresponding to the burnt fuse.

In the test mode, when the signal SRT becomes high, the signal TSR1 varies depending upon the internal address signal RAdd0. Thus, the output from the NAND gate 46 may be controlled by the internal address signal RAdd0. Since the fuses 41 are not burnt prior to memory cell reparation, the output from the NOT gate 44 is constantly high independently of which one of the signals X0 to Xs may become high when the internal address signal X0 to Xs are inputted. Therefore, the internal address signal RAdd0 should be high for operation of the second test row decoder 9b.

In the test mode, when the signal SCT goes high, the NAND gates 89, and 94 to 96 perform a similar function to the NOT gate to output the negation of the outputs from the gates 88a to 88d. One of the outputs from the NAND gates 89, and 94 to 96 goes low, setting one of the signals SCS0 to SCS3 to the high level.

Setting one of the signals SCS0 to SCS3 to the high level causes the exclusive-NOR gate 106 to output the low level signal. Then, the signals CSLi outputted from all of the plurality of signal generating circuits 109 are fixed at the low level. For example, if the signal SCS0 is high among the signals SCS0 to SCS3, the output from the NAND gate 100 which is the NAND of the signal CDE rising simultaneously with the row address strobe signal and the signal SCS0 goes low. Thus, only the signal SCSL0 among the signals SCSL0 to SCSL3 for selection of the bit line of the spare memory cell column goes high to select one of the spare memory cell columns.

The signal SRT is set to the low level and the signal SCT is set to the high level for selection of the area 1C by the normal row decoder 2a and the second test column decoder 10b in the test mode. The signal SRT is set to the high level and the signal SCT is set to the low level for selection of the area 1B by the second test row decoder 9b and the normal column decoder 4a in the test mode.

In this manner, the semiconductor memory device of the first preferred embodiment performs the test by using the timing of memory cell selection of the conventional semiconductor memory device to readily make common the components similar to those of the conventional semiconductor memory device, reducing the circuit scale.

The test signals SRT and SCI may perform switching between the four conditions. This permits easy formation of the semiconductor memory device capable of testing the spare memory cells in the cross point area without additional external address signals.

Second Preferred Embodiment

Figure 13:
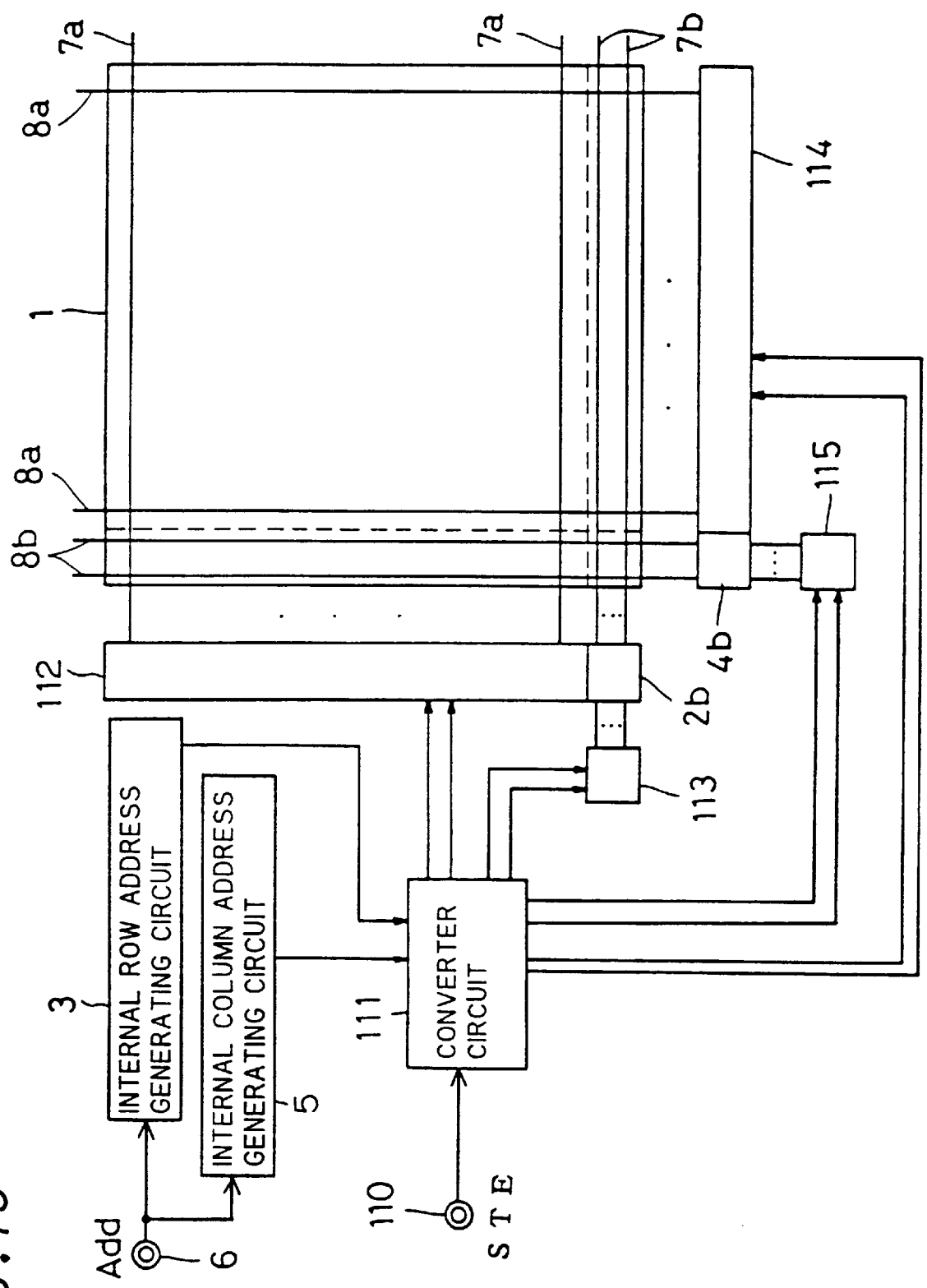
FIG. 13 is a block diagram of the semiconductor memory device according to a second preferred embodiment of the present invention.

Description will be given on the semiconductor memory device according to a second preferred embodiment of the present invention. FIG. 13 is a schematic block diagram of the DRAM according to the second preferred embodiment of the present invention. In FIG. 13, the reference numeral 110 designates an input terminal for receiving the control signal in the test mode; 111 designates an converter circuit connected to the input terminal 110 for converting the internal row address signal and internal column address signal provided respectively from the internal row address generating circuit 3 and internal column address generating circuit 5; 112 designates a normal row decoder for selecting the normal row in response to the internal row address signal outputted from the converter circuit 111 and the control signal; 113 designates a second test row decoder for selecting the spare memory cell row in response to the internal row address signal outputted from the converter circuit 111 and the control signal; 114 designates a normal column decoder for selecting the normal column in response to the internal column address signal outputted from the converter circuit 111 and the control signal; and 115 designates a second test column decoder for selecting the spare memory cell column in response to the internal column address signal outputted from the converter circuit 111 and the control signal.

The semiconductor memory device having a structure shown in FIG. 13 converts the internal address signal by the converter circuit 111 and also performs switching between the area selected by the normal row decoder 112 and the normal column decoder 114, the area selected by the second test row decoder 113 and the normal column decoder 114, the area selected by the normal row decoder 112 and the second test column decoder 115, and the area selected by the second test row decoder 113 and the second column decoder 115 by using the control signal from the input terminal 110 and the internal address signal. In the normal mode, the normal row decoder 112 and the normal column decoder 114 select the normal memory cell in response to the internal address signal.

Figure 14:
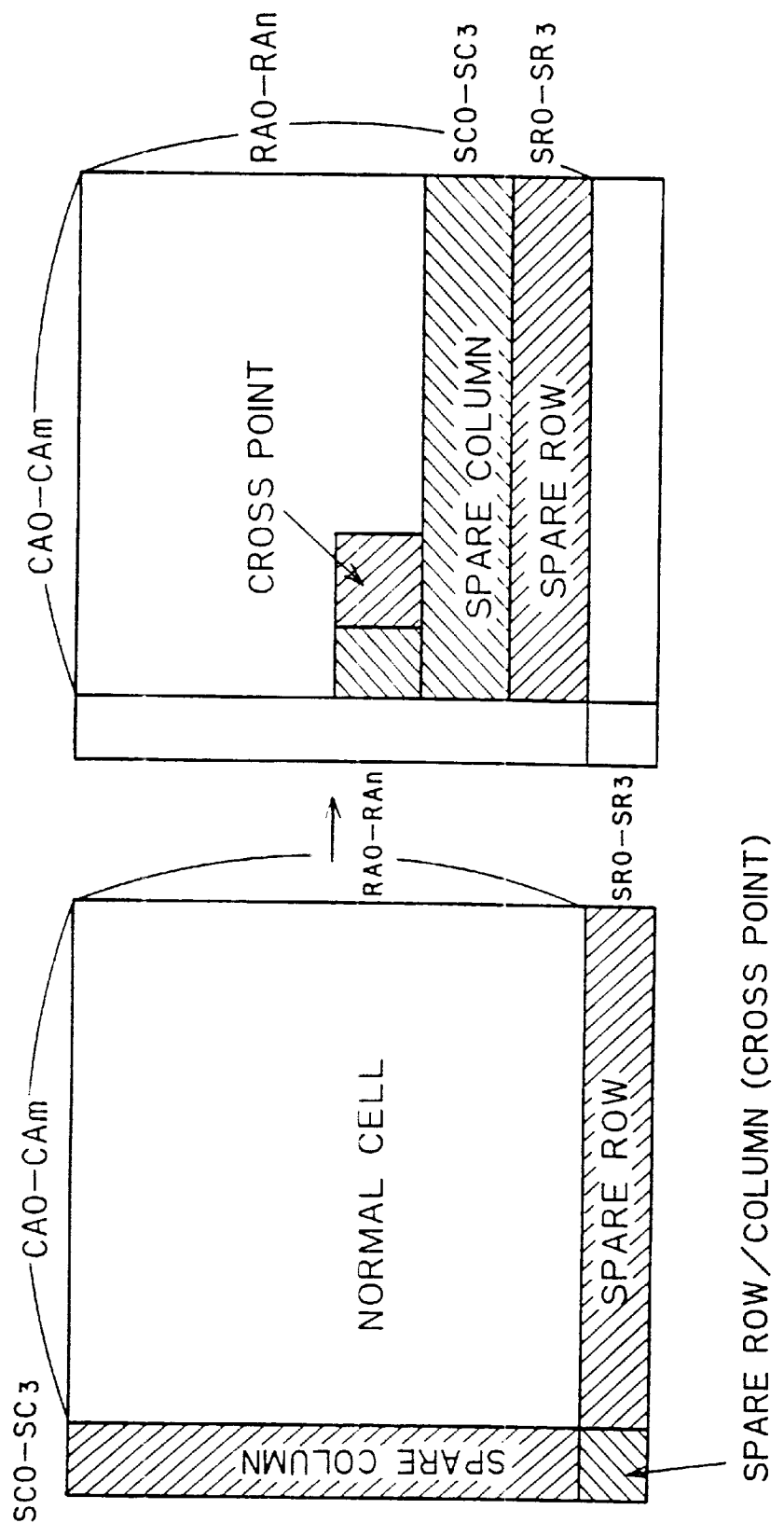
FIG. 14 conceptually illustrates the addresses of a memory cell array shown in FIG. 13.

FIG. 14 conceptually illustrates a physical memory cell arrangement and a memory cell arrangement in an address space in the test mode. The physical memory cell arrangement is shown on the left side of FIG. 14, and the memory cell arrangement in the address space is shown on the right side thereof. In the test mode, addresses are converted, and the normal memory cells are addressed as shown on the right of FIG. 14 for selection of the memory cells in the spare row area, the spare column area and the cross point area (where n>m).

Table 2 indicates the relationship between a control signal STE inputted at the input terminal 110, addresses, and the areas to be selected.

TABLE 2

|  | STE | address |
|---|---|---|
| normal cell | open or 0 | RA0–RAn, CA0–CAm |
| spare row (SR0–SR3) | 1 | RA0–RA3, CA0–CAm |
| spare column (SC0–SC3) | 1 | RA4–RA7, CA0–CAm |
|  |  | RA8–RA11, CA0–CA(n − m) |
| cross point | 1 | RA8–RA11, CA(n − m + 1) |

Table 3 indicates corresponding addresses before and after conversion in the converter circuit 111.

TABLE 3

| BEFORE CONVERSION | | AFTER CONVERSION | |
|---|---|---|---|
| $\begin{pmatrix} RA0 \\ CA0 \end{pmatrix}$ ~ $\begin{pmatrix} RA0 \\ CAm \end{pmatrix}$ | → | $\begin{pmatrix} SR0 \\ CA0 \end{pmatrix}$ ~ $\begin{pmatrix} SR0 \\ CAm \end{pmatrix}$ | |
| $\begin{pmatrix} RA3 \\ CA0 \end{pmatrix}$ ~ $\begin{pmatrix} RA3 \\ CAm \end{pmatrix}$ | → | $\begin{pmatrix} SR3 \\ CA0 \end{pmatrix}$ ~ $\begin{pmatrix} SR3 \\ CAm \end{pmatrix}$ | |
| $\begin{pmatrix} RA4 \\ CA0 \end{pmatrix}$ ~ $\begin{pmatrix} RA4 \\ CAm \end{pmatrix}$ | → | $\begin{pmatrix} SC0 \\ RA0 \end{pmatrix}$ ~ $\begin{pmatrix} SC0 \\ RAm \end{pmatrix}$ | |
| $\begin{pmatrix} RA7 \\ CA0 \end{pmatrix}$ ~ $\begin{pmatrix} RA7 \\ CAm \end{pmatrix}$ | → | $\begin{pmatrix} SC3 \\ RA0 \end{pmatrix}$ ~ $\begin{pmatrix} SC3 \\ RAm \end{pmatrix}$ | |
| $\begin{pmatrix} RA8 \\ CA0 \end{pmatrix}$ ~ $\begin{pmatrix} RA8 \\ CA(n-m) \end{pmatrix}$ | → | $\begin{pmatrix} SC0 \\ RAm+1 \end{pmatrix}$ ~ $\begin{pmatrix} SC0 \\ RAn \end{pmatrix}$ | |
| $\begin{pmatrix} RA11 \\ CA0 \end{pmatrix}$ ~ $\begin{pmatrix} RA11 \\ CA(n-m) \end{pmatrix}$ | → | $\begin{pmatrix} SR3 \\ RAm+1 \end{pmatrix}$ ~ $\begin{pmatrix} SR3 \\ RAn \end{pmatrix}$ | |
| $\begin{pmatrix} RA8 \\ CA(n-m+1) \end{pmatrix}$ ~ $\begin{pmatrix} RA8 \\ CA(n-m+4) \end{pmatrix}$ | → | $\begin{pmatrix} SR0 \\ SC0 \end{pmatrix}$ ~ $\begin{pmatrix} SR0 \\ SC3 \end{pmatrix}$ | |
| $\begin{pmatrix} RA11 \\ CA(n-m+1) \end{pmatrix}$ ~ $\begin{pmatrix} RA11 \\ CA(n-m+4) \end{pmatrix}$ | → | $\begin{pmatrix} SR3 \\ SC0 \end{pmatrix}$ ~ $\begin{pmatrix} SR3 \\ SC3 \end{pmatrix}$ | |

Figure 15:
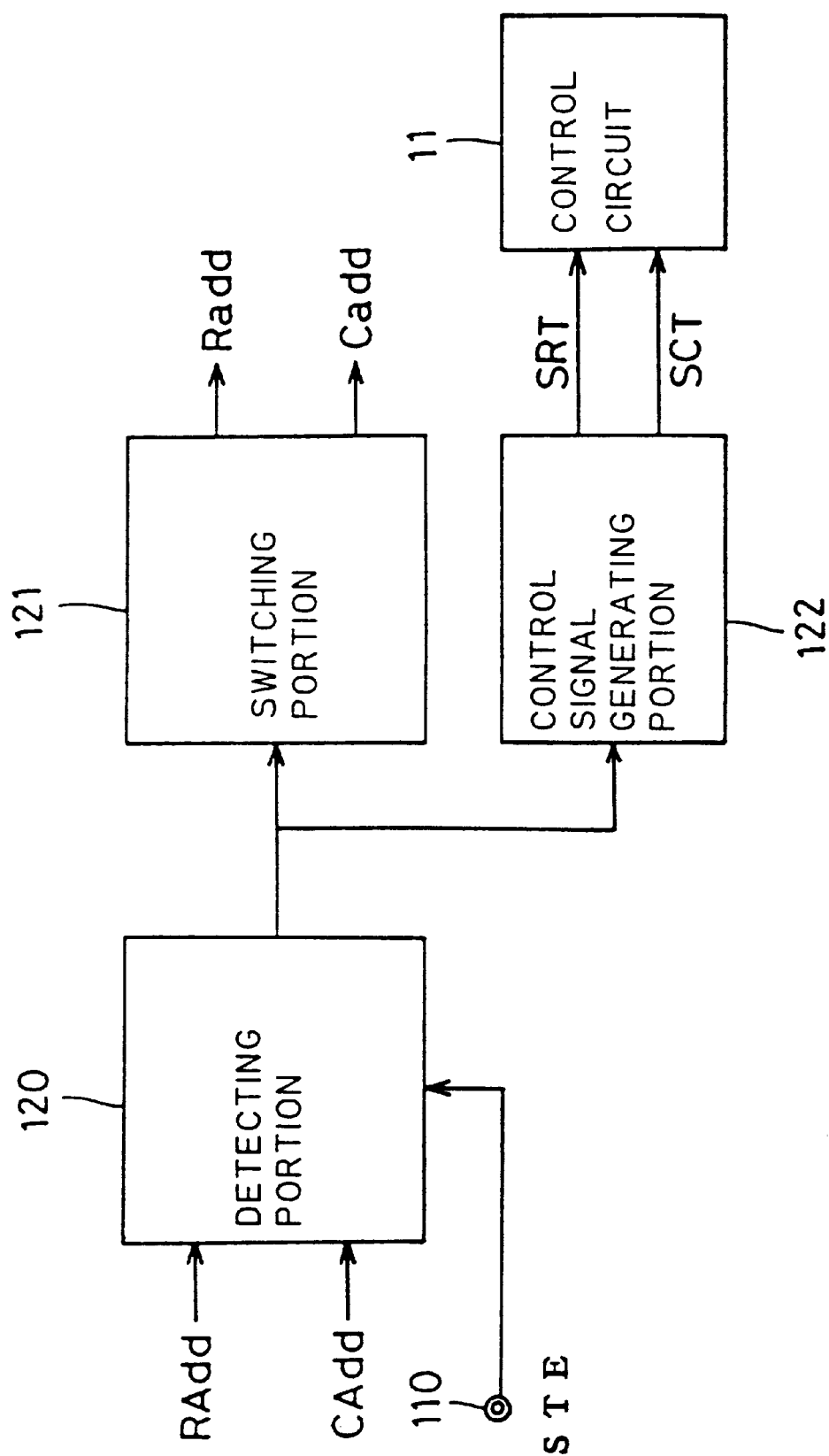
FIG. 15 is a block diagram of a converter circuit shown in FIG. 14.

FIG. 15 is a block diagram of an example of the converter circuit 111. In FIG. 15, the reference numeral 120 designates a detecting portion for detecting the address before conversion; 121 designates a switching portion for switching the internal address signal in response to the result of detection of the detecting portion 120; and 122 designates a control signal generating portion for generating the control signals SRT and SCT in response to the result of detection of the detecting portion 120.

For example, when the conversion indicated in Table 3 is performed, it is assumed that, in the test mode, a column address signal CAdd sequentially changes to specify the column addresses CA0 to CAm and a row address signal RAdd is increased by one each time the transition of the column address signal CAdd between the column addresses CA0 to CAm is finished. It is also assumed that m is less than n.

In such a case, the outputs from the switching portion 121 and the control signal generating portion 122 are changed at the boundaries between three sections: a section having the row addresses RA0 to RA3, a section having the row addresses RA4 to RA7, and a section having the row addresses RA8 to RA11, as indicated in Tables 4 and 5.

TABLE 4

| STE | RAdd | CAdd | SRT | SCT | switching in switching portion |
|---|---|---|---|---|---|
| H | RA0–RA3 | arbitrary | H | L | no switching (RAdd→Radd, CAdd→Cadd) |
| H | RA4–RA7 | arbitrary | L | H | RAdd→Cadd CAdd→Radd |
| H | RA8–RA11 | CA0–CA(n-m) | L | H | RAdd→Cadd CAdd→Radd |
| H | RA8–RA11 | CA(n − m + 1)– CA(n − m + 4) | H | H | no switching (RAdd→Radd, CAdd→Cadd) |
| L or open | arbitrary | arbitrary | L | L | no switching |

TABLE 5

|  | S-Address = SR/SC | address |
|---|---|---|
| normal cell | open or 0/open or 0 | (SSR = 0, RA0–RAn) (SSC = 0, CA0–CAm) |
| spare row (SR0–SR3) | 1/0 | (SSR = 1, RA0–RA3) (SSC = 0, CA0–CAm) |
| spare column (SC0–SC3) | 0/1 | (SSR = 0, RA0–RAn) (SSC = 1, CA0–CA3) |
| cross point | 1/1 | (SSR = 1, RA0–RA3) (SSC = 1, CA0–CA3) |

(1) In the cases of the row addresses RA0 to RA3, the control signal generating portion 122 sets the control signal SRT to the high level and the control signal SCT to the low level independently of the value of the column address. The switching portion 121 performs no switching and does not interchange the internal row address signal RAdd and the internal column address signal CAdd with each other but outputs the signals RAdd and CAdd intactly as signals Radd and Cadd, respectively.

(2) In the cases of the row addresses RA4 to RA7, the control signal generating portion 122 sets the control signal SRT to the low level and the control signal SCT to the high level independently of the value of the column address. The switching portion 121 performs switching to output the internal row address signal RAdd as the signal Cadd and the internal column address signal CAdd as the signal Radd.

(3) In the cases of the row addresses RA8 to RA11 and the column addresses CA0 to CA(n-m), the switching portion 121 and the control signal generating portion 122 make the same setting as (2).

(4) In the cases of the row addresses RA8 to RA11 and the column addresses CA(n-m+1) to CA(n-m+4), the switching portion 121 performs no switching, and the control signal generating portion 122 outputs the control signals SRT and SCT both of which are high.

The control signal received by the semiconductor memory device constructed as in the second preferred embodiment may be only the control signal STE, reducing the number of pins of the semiconductor memory device.

In the second preferred embodiment like the first preferred embodiment, application of no signals from the exterior (open state) and setting of the control signals SRT and SCT to the low level permit access to the normal cell area without a hitch during normal use.

In the second preferred embodiment, the normal row decoder also functions as the first test row decoder, and the normal column decoder also functions as the first test column decoder. Although it is assumed in the above description that n>m, the present invention is also applicable when n≦m.

Third Preferred Embodiment

Figure 16:
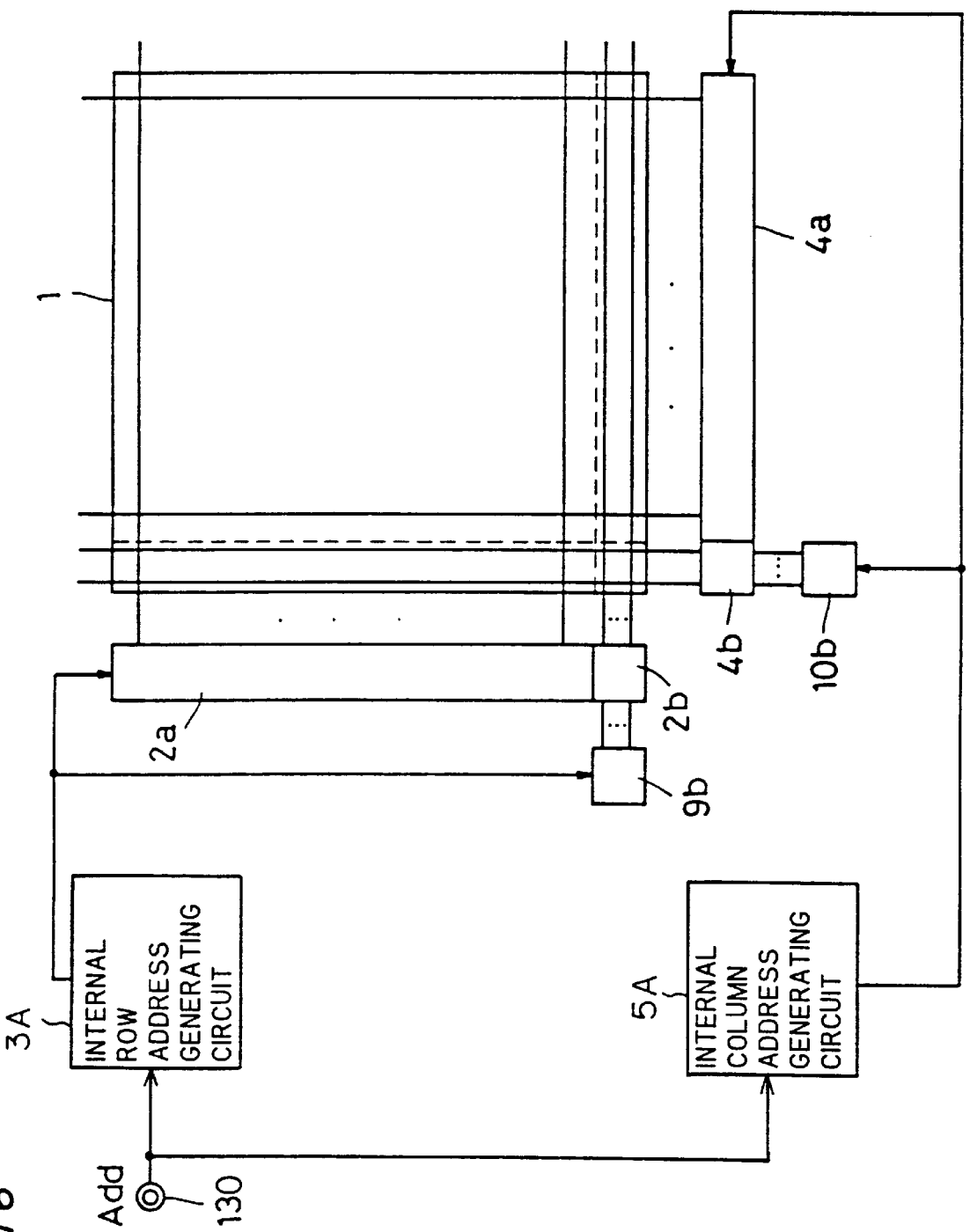
FIG. 16 is a block diagram of the semiconductor memory device according to a third preferred embodiment of the present invention.

Description will be given on the semiconductor memory device according to a third preferred embodiment of the present invention. FIG. 16 is a schematic block diagram of the DRAM according to the third preferred embodiment of the present invention. In FIG. 16, the reference numeral 130 designates an input terminal for receiving an external address signal Add including a greater number of bits than the conventional bits; the reference character 3A designates an internal row address generating circuit connected to the input terminal 130 for generating the internal row address signal RAdd including a greater number of bits than the conventional bits on the basis of the external address signal Add including a greater number of bits than the conventional bit: and 5A designates an internal column address generating circuit connected to the input terminal 130 for generating the internal column address signal CAdd including a greater number of bits than the conventional bits on the basis of the external address signal Add including a greater number of bits than the conventional bits.

Figure 17:
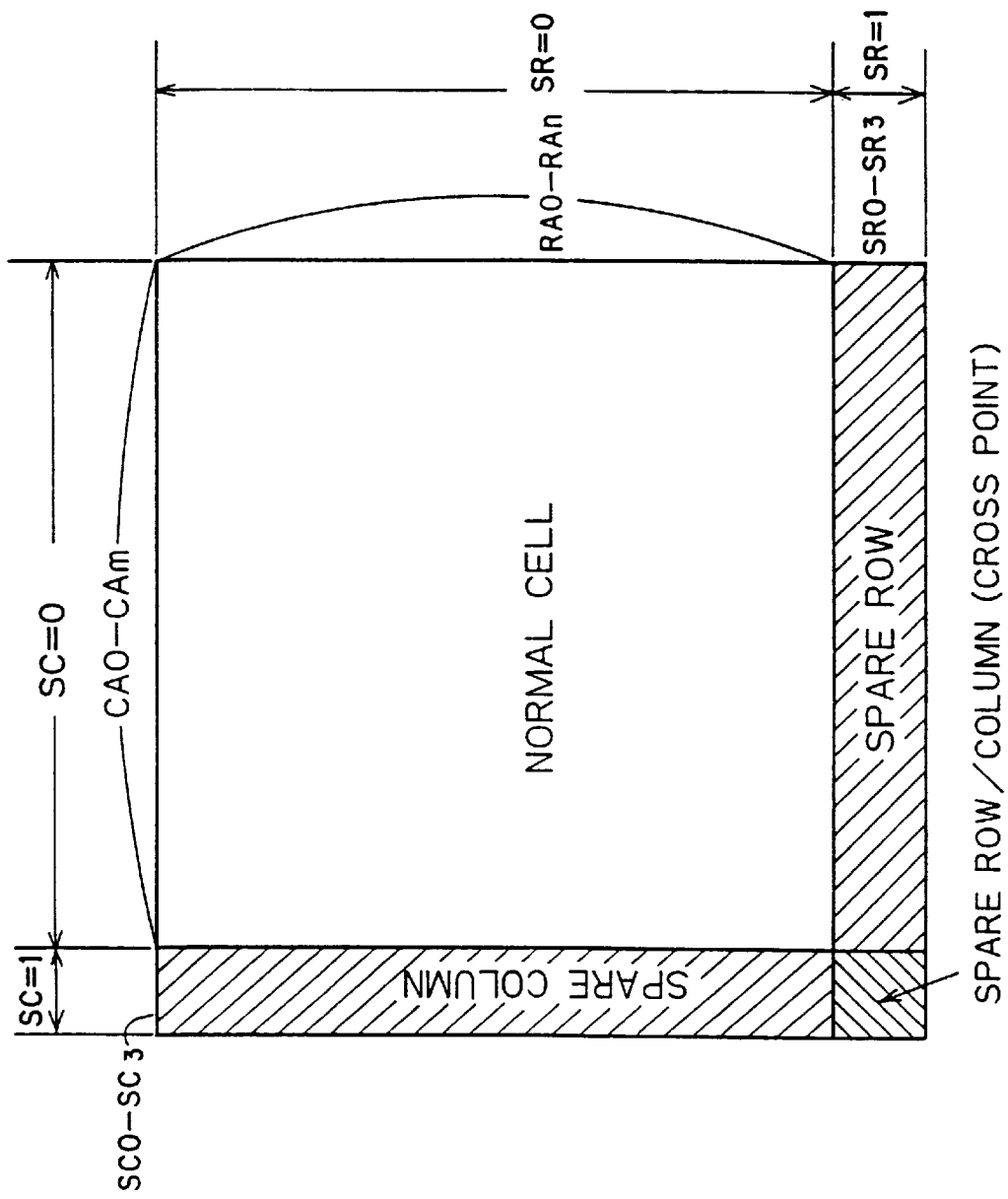
FIG. 17 conceptually illustrates the addresses of a memory cell array shown in FIG. 16.

With reference to FIG. 17, the spare row area, the spare column area and the cross point area are regarded as being in an area extended from the address plane of the normal cells, that is, being within the plane of the row addresses (SR=1, RA0 to RA3) and the column addresses (SC=1, CA0 to CAm). The bits of an internal row address signal S-RAdd and an internal column address signal S-CAdd are additionally inputted from the exterior. Accessing the normal cells and the spare cells similarly by using these addresses allows the access address of the spare memory cells to be specified as in the first preferred embodiment. No application of an external address signal S-Add from the exterior (open state) and the internal setting of the internal row address signal S-RAdd to zero or its equivalent permit access to the normal memory cell without a hitch during normal use.

Figure 18:
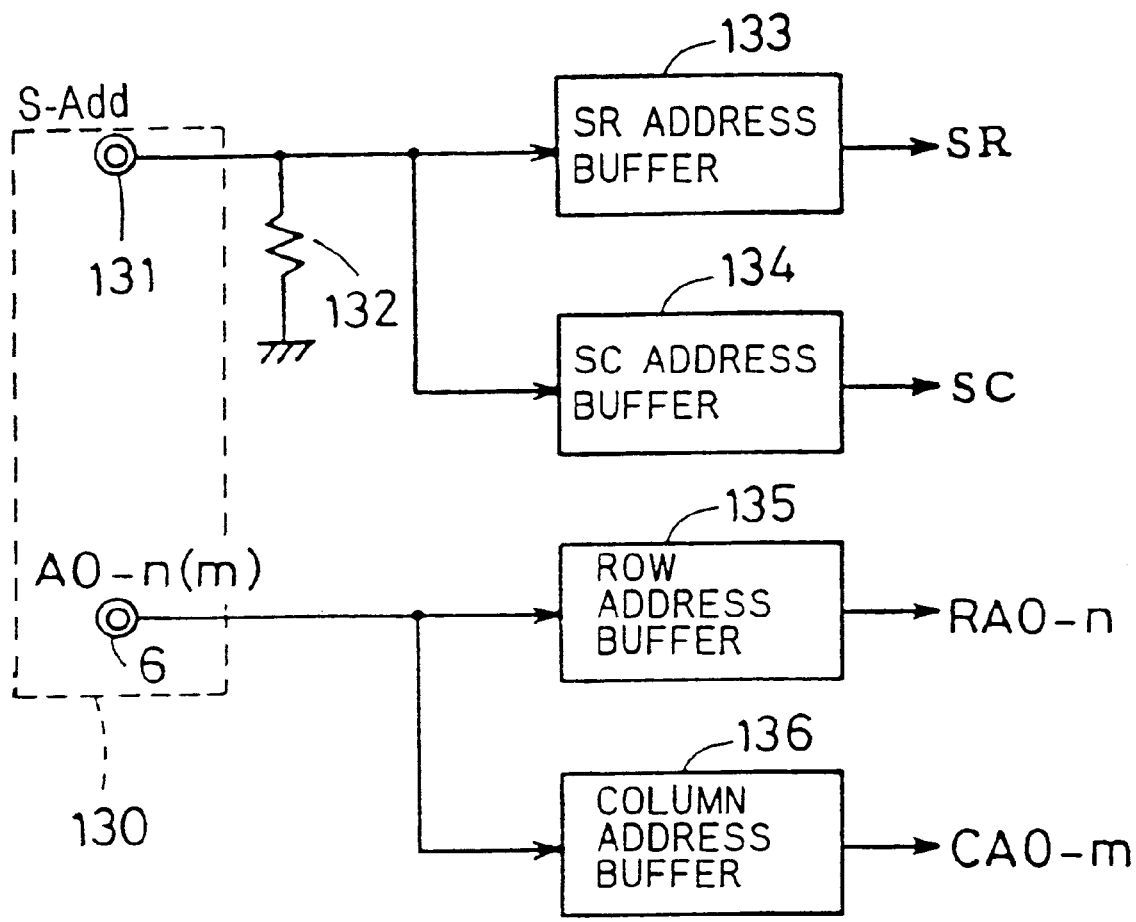
FIG. 18 is a fragmentary block diagram of an internal row address generating circuit and an internal column address generating circuit shown in FIG. 16.

FIG. 18 is a block diagram of the internal row address generating circuit 3A and internal column address generating circuit 5A shown in FIG. 16. In FIG. 18, the reference numeral 131 designates a spare address signal input terminal in the input terminal 130; 132 designates a resistor connected between the spare address signal input terminal 131 and a ground potential point; 133 designates an SR address buffer for generating the control signal SRT on the basis of the spare address signal S-Add at the spare address signal input terminal 131; 134 designates an SC address buffer for generating the control signal SCT on the basis of the spare address signal S-Add at the spare address signal input terminal 131; 135 designates a row address buffer corresponding to the internal row address generating circuit 3 shown in FIG. 1; and 136 designates a column address buffer corresponding to the internal column address generating circuit 5 shown in FIG. 1.

Figure 19:
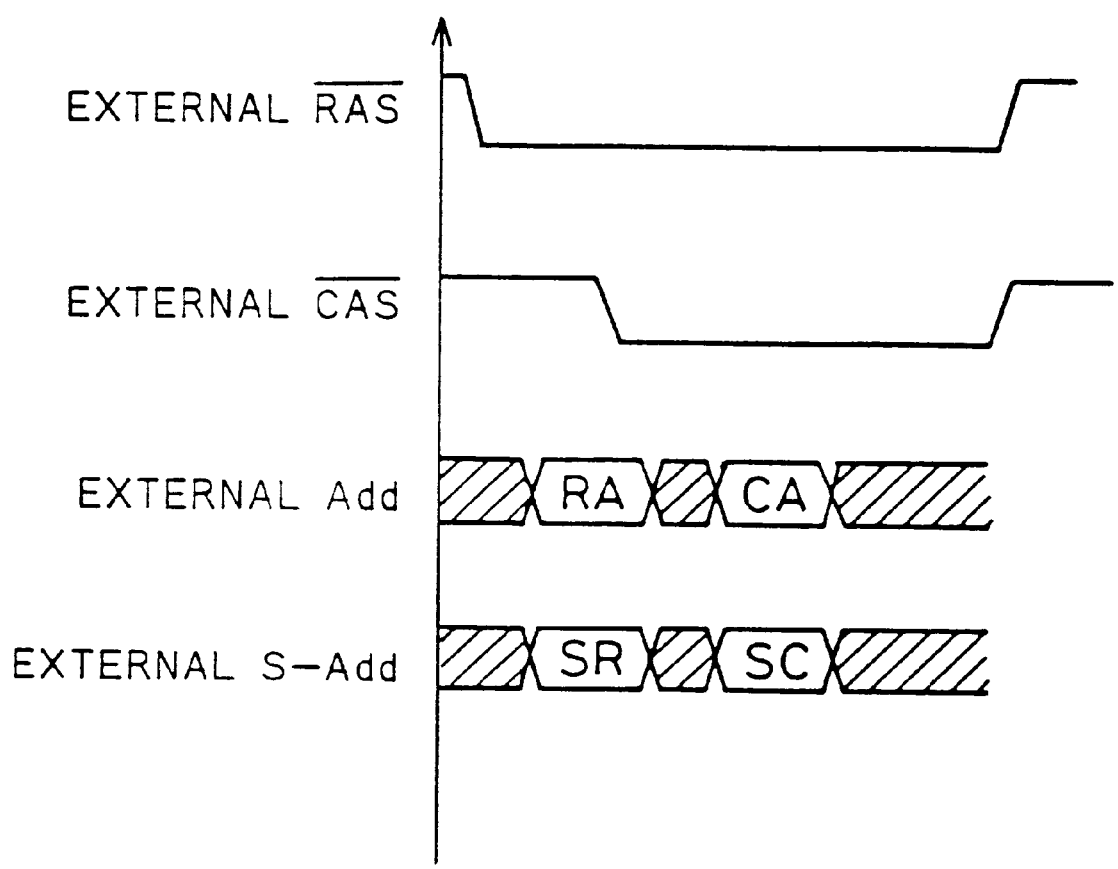
FIG. 19 is a timing chart illustrating the receipt of a spare address signal.

The SR address buffer 133 and the SC address buffer 134 shown in FIG. 18 receive data by using time sharing technique as illustrated in FIG. 19. This reduces the number of input pins of the semiconductor memory device.

Other constructions of the third preferred embodiment may be similar to those of the semiconductor memory device of the first preferred embodiment shown in FIG. 1. Specifically, a structure corresponding to the control circuit 11 of FIG. 1 should be incorporated in the internal row address generating circuit 3A and the internal column address generating circuit 5A.

The third preferred embodiment constructed as above described requires one additional external address pin but no control pins, achieving the semiconductor memory device of the present invention with a relatively simple construction.

Fourth Preferred Embodiment

Figure 20:
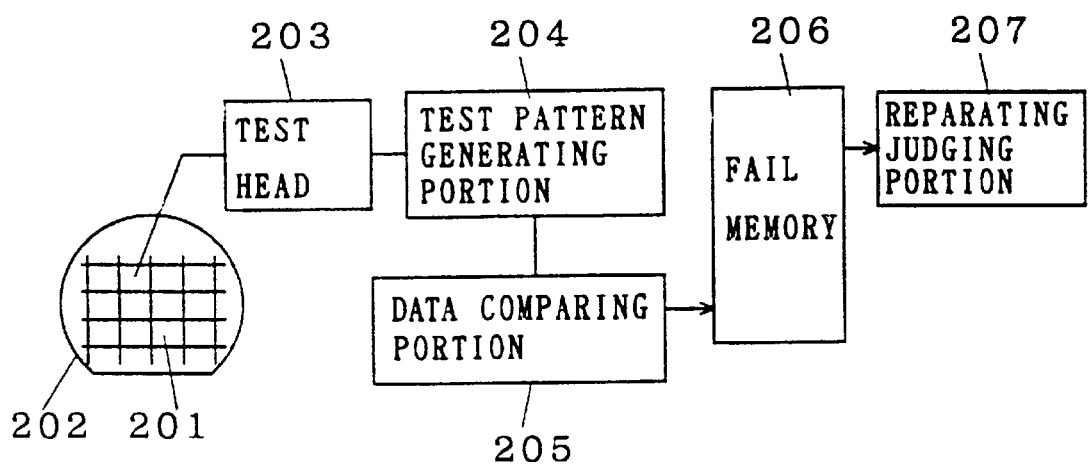
FIG. 20 is a block diagram of a system for repairing a defect in the memory cell array.
Figure 21:
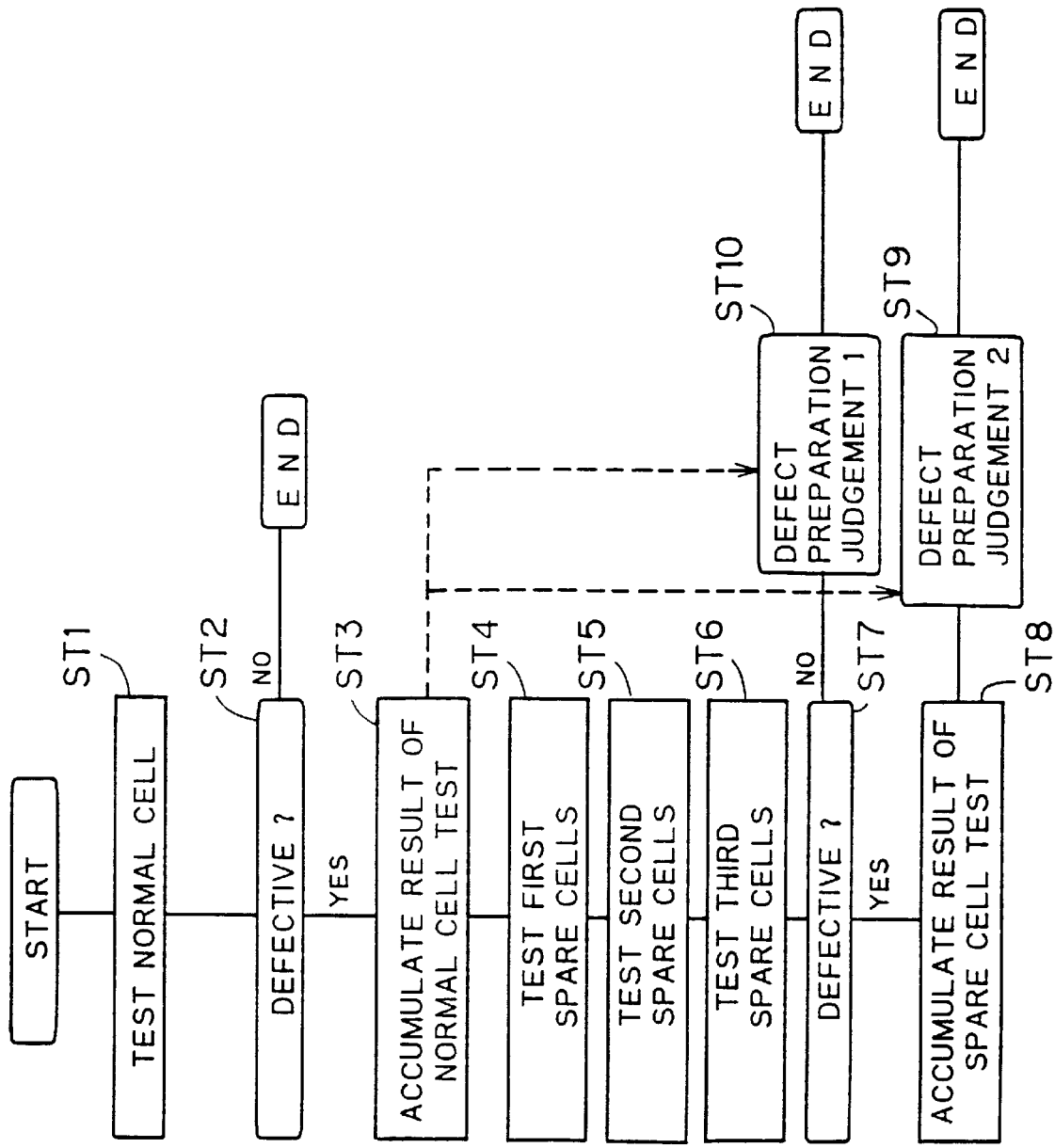
FIG. 21 is a flow chart showing a procedure for repairing a defective memory cell according to a fourth preferred embodiment of the present invention.

FIG. 20 is a block diagram of a system for repairing a defect in the memory cell array. In FIG. 20, the reference numeral 201 designates a semiconductor memory device having a memory cell array to be tested; 202 designates a wafer having a plurality of semiconductor memory devices 201 formed thereon; 203 designates a test head including an output portion for providing a power supply for a sample to be applied to the semiconductor memory device 201 serving as a device to be measured, a timing generator output, and a pattern generator output, and an input portion for receiving a device output into a measuring portion; 204 designates a test pattern generating portion for generating a test pattern; 205 designates a data comparing portion for comparing an output from the semiconductor memory device 201 received by the test head 203 with an expected value for the test pattern generated by the test pattern generating portion 204; 206 designates a fail memory for storing therein failure information about the memory cells regarded as defective on the basis of the result of comparison by the data comparing portion 205; and 207 designates a reparation judging portion for replacing a defective memory cell with a spare memory cell on the basis of the failure information stored in the fail memory 206 to repair the defect FIG. 21 is a flow chart showing an algorithm for effectively repairing a defect in the memory cell array for the semiconductor memory device having the structure of the first to third preferred embodiments.

In the step ST1, the normal memory cell is tested. In the step ST2, the result of test in the step ST1 is judged. If the normal memory cell is not defective as the result of the judgment, the test is terminated.

If the normal memory cell is judged as being defective in the step ST2, the flow proceeds to the step ST3 wherein the defect information is accumulated for defect reparation judgement.

If the normal memory cell is defective, all of the spare memory cells are tested in the steps ST4 to ST6. For example, first spare memory cells included in the area 1B shown in FIG. 1 are tested in the step ST4. Second spare memory cells included in the area 1C are tested in the step ST5. Third spare memory cells included in the area 1D are tested in the step ST6.

In the step ST7, the results of the spare memory cell tests performed in the steps ST4 to ST6 are judged. If no spare memory cell is defective, the flow proceeds to the step ST10 wherein the normal row and column having the defect are replaced with a predetermined spare memory cell row or spare memory cell column or both (defect reparation judgement 1).

If a defect is judged as being present in the spare memory cells in the step ST7, the defect information is accumulated for defect reparation judgement.

If a defect is present in the spare memory cells, the flow proceeds to the step ST9 wherein defect reparation judgement and reparation are performed on other than portions associated with the defective spare memory cell (defect reparation judgement 2).

Since the spare memory cells in the area 1D shown in FIG. 1, or the cross point area, are tested and the result thereof is reflected in the step ST6, the defective spare memory cell row or spare memory cell column is not used for replacement. Thus, yield enhancement is expected.

Fifth Preferred Embodiment

Figure 22:
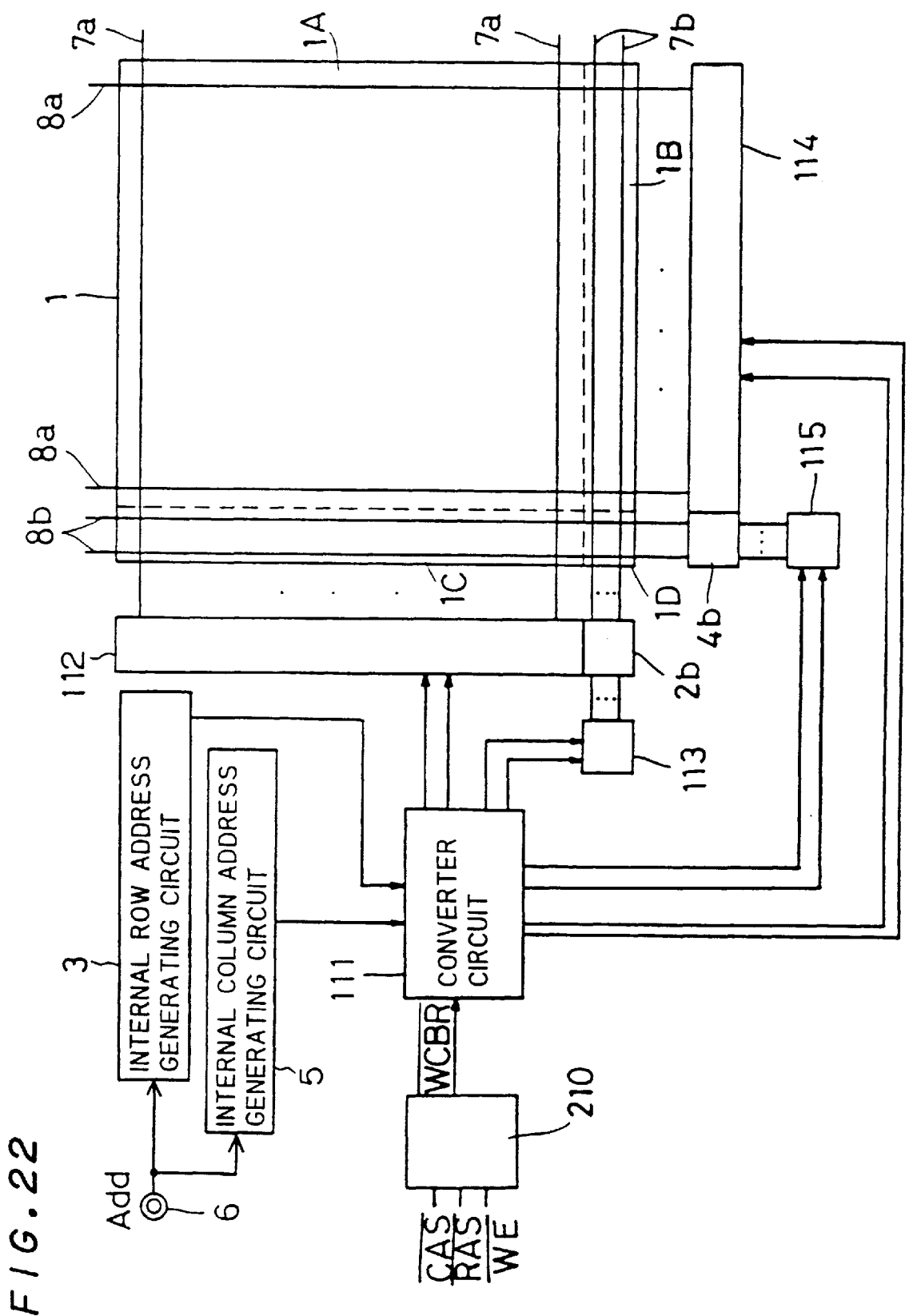
FIG. 22 is a schematic block diagram of the semiconductor memory device according to fifth preferred embodiment of the present invention.

FIG. 22 is a schematic block diagram of the semiconductor memory device according to a fifth preferred embodiment of the present invention. Referring to FIG. 22, the redundant memory cells are divided into three spare areas; the area 1B wherein the spare memory cells selected by the spare row decoder 2b and the normal column decoder 114 are arranged, the area 1C wherein the spare memory cells selected by the normal row decoder 112 and the spare column decoder 4b are arranged, and the area 1D wherein the spare memory cells selected by the spare row decoder 2b and the spare column decoder 4b are arranged. Specifically, these three spare areas are selected by serial access without particular mode signal input.

Figure 23:
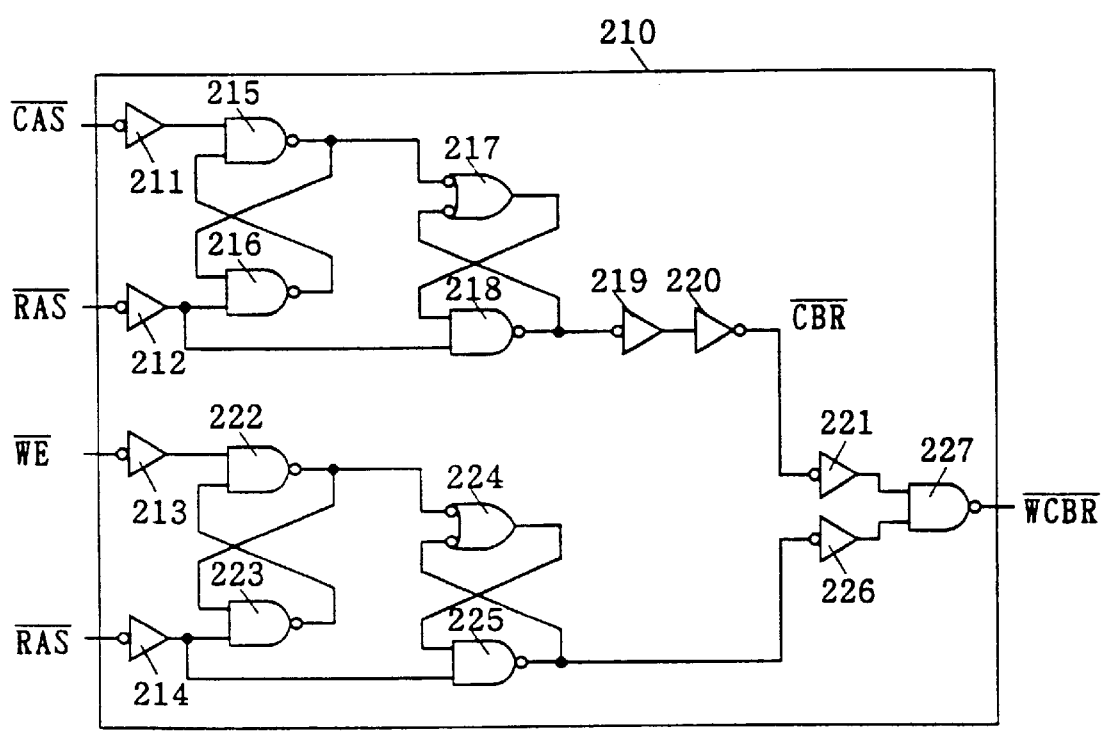
FIG. 23 is a logic diagram of a mode switching signal generating circuit shown in FIG. 22.

The semiconductor memory device of the fifth preferred embodiment comprises a mode switching signal generating circuit in addition to the semiconductor memory device of the second preferred embodiment shown in FIG. 13. FIG. 23 is a logic diagram of the mode switching signal generating circuit for the semiconductor memory device according to the fifth preferred embodiment of the present invention. In FIG. 23, the reference numeral 210 designates the mode switching signal generating circuit for generating a mode switching signal $\overline{WCBR}$ on the basis of the column address strobe signal $\overline{CAS}$, the row address strobe signal $\overline{RAS}$, and a write enable signal $\overline{WE}$.

The mode switching signal $\overline{WCBR}$ generated by the mode switching signal generating circuit 210 corresponds to, for example, the control signal STE at the input terminal 110 for the semiconductor memory device shown in FIG. 13.

The mode switching signal generating circuit 210 comprises an inverter 211 for inverting the column address strobe signal $\overline{CAS}$; an inverter 212 for inverting the row address strobe signal $\overline{RAS}$; a NAND gate 215 having a first input end receiving the output from the inverter 211, a second input end receiving the output from a NAND gate 216, and an output end for providing the NAND of the signals at its first and second input ends; the NAND gate 216 having a first input end receiving the output from the inverter 212, a second input end receiving the output from the NAND gate 215, and an output end for providing the NAND of the signals at its first and second input ends; a NAND gate 217 having a first input end receiving the output from the NAND gate 215, a second input end receiving the output from a NAND gate 218, and an output end for providing the NAND of the signals at its first and second input ends; the NAND gate 218 having a first input end receiving the output from the NAND gate 217, a second input end receiving the output from the inverter 212, and an output end for providing the NAND of the signals at its first and second input ends; three inverters 219 to 221 connected in series for inverting the output from the NAND gate 218 to output the inverted signal; an inverter 213 for inverting the write enable signal $\overline{WE}$; an inverter 214 for inverting the row address strobe signal $\overline{RAS}$; a NAND gate 222 having a first input end receiving the output from the inverter 213, a second input end receiving the output from a NAND gate 223, and an output end for providing the NAND of the signals at its first and second input ends; the NAND gate 223 having a first input end receiving the output from the NAND gate 222, a second input end receiving the output from the inverter 214, and an output end for providing the NAND of the signals at its first and second input ends; a NAND gate 224 having a first input end receiving the output from the NAND gate 222, a second input end receiving the output from a NAND gate 225, and an output for providing the NAND of the signals at its first and second input ends; the NAND gate 225 having a first input end receiving the output from the NAND gate 224, a second input end receiving the output from the inverter 214, and an output end for providing the NAND of the signals at its first and second input ends; an inverter 216 for inverting the output from the NAND gate 225; and a NAND gate 227 having first and second input ends receiving the respective outputs from the inverters 221 and 226 for outputting the NAND of the signals at its first and second input ends.

FIGS. 24A to 24D are a timing chart showing a test mode in cycle and a spare access cycle of the mode switching signal generating circuit of FIG. 23. FIG. 24A illustrates the row address strobe signal $\overline{RAS}$, FIG. 24B illustrates the column address strobe signal $\overline{CAS}$, FIG. 24C illustrates the write enable signal $\overline{WE}$ and FIG. 24D illustrates the address signal Add.

The semiconductor memory device is put in the test mode in cycle with Write- $\overline{CAS}$ before $\overline{RAS}$ timing. When the row address strobe signal $\overline{RAS}$ falls, the output signal $\overline{WCBR}$ from the mode switching signal generating circuit 210 shown in FIG. 23 is changed to the low level.

A test mode in signal provided by address key specification in FIGS. 24A to 24D puts the semiconductor memory device into the spare test mode for desired spare test.

Figure 25A:
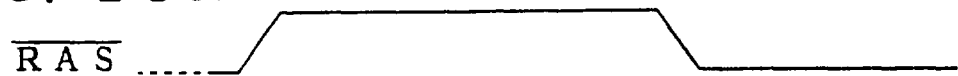
FIGS. 25A to 25C are a timing chart for illustrating the operation of the mode switching signal generating circuit of FIG. 23.
Figure 25B:
Figure 25C:

FIG. 25A illustrates the row address strobe signal $\overline{RAS}$, FIG. 25B illustrates the column address strobe signal $\overline{CAS}$, and FIG. 25C illustrates the write enable signal $\overline{WE}$.

In the spare access cycle, the row address is read when the row address strobe signal $\overline{RAS}$ is high, and the column address is read when the row address strobe signal $\overline{RAS}$ falls and the column address strobe signal $\overline{CAS}$ falls.

The redundant memory cells are divided into the three areas: the spare row, the spare column and the intersection of the spare matrix. These areas are tested prior to the defect reparation. The spare areas are selected in such a manner that signals A0 and A1 are applied from normal address input pins to individually select the respective areas as indicated in Table 6. The selection of the respective memory cells in each of the areas is accomplished by providing a predetermined address in the spare memory cell array from other address pins (A2, A3, and the like) to be normally used.

TABLE 6

| access area | (A0, A1) | address |
| --- | --- | --- |
| normal cell | (0, 0) | RA0–RAn, CA0–CAm |
| spare row (SR0–SR3) | (1, 0) | RA0–RA3, CA0–CAm |
| spare column (SC0–SC3) | (0, 1) | RA0–RAn, CA0–CA3 |
| cross point | (1, 1) | RA0–RA3, CA0–CA3 |

If such a test mode in signal is not inputted, the semiconductor memory device is put in the normal mode wherein the normal access is performed to carry out the normal mode operation.

For example, it is assumed that four spare rows are denoted as SR0 to SR3 and four spare columns are denoted as SC0 to SC3. The access address is inputted to these spare rows and spare columns as indicated in Table 6 in a manner to be described below.

(1) spare row test mode

The row address inputted at the address input terminals A0, A1 selects one of the four spare memory cell rows. Column addresses A0 to Am subsequently inputted specify the column address in the selected spare row to specify the access address of the cell in the spare row.

(2) spare column test mode

The row address inputted at the address inputs A0 to An specifies the row address of the four spare columns. The column addresses A0, A1 subsequently inputted select one of the four spare memory cell columns to specify the access address of the cell in the spare column.

(3) spare row/column test mode

The row address inputted at the address inputs A0, A1 and the column addresses A0, A1 subsequently inputted specify the access address of the cell at the intersection of the four spare rows and four spare columns.

In this manner, the address input from the address pin to be normally used may readily address the memory cell in the spare area, permitting access to the specified spare memory cell without a hitch.

This arrangement is effective in the defect reparation test after packaging wherein the use of extra test pads is not allowed.

Figure 26:
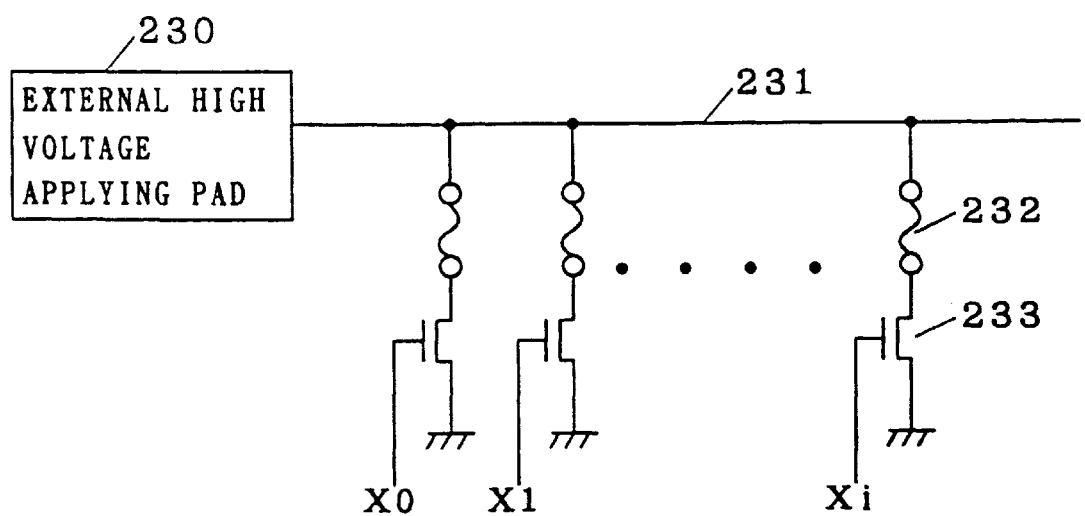
FIG. 26 is a circuit diagram of a defect repairing mechanism using electric fuses.

For defect reparation after packaging, a so-called electric fuse is used which is burnt by electrical signal input from an external pad in place of laser blow, for example. FIG. 26 is a circuit diagram of a defect reparation mechanism using the electrical fuses in the semiconductor memory device. In the semiconductor memory device shown in FIG. 26, an external high voltage applying pad 230 is exposed to the exterior of the semiconductor memory device. An interconnecting line 231 connected to the external high voltage applying pad 230 is drawn into the package of the semiconductor memory device. The interconnecting line 231 is connected to i parallel-connected electrical fuses 232 which in turn are connected to the drains of i N-channel MOS transistors 233 having sources grounded and gates receiving the signals X0 to Xi, respectively.

For instance, a high voltage (10 to 20 V) is applied from the exterior to the external high voltage applying pad 230 to selectively set the signals X0 to Xi to be applied to the gate of the transistor connected to the electrical fuse to be burnt to the high level, causing the transistor to conduct. The desired one of the electrical fuses 232 is melted and burnt buy a large current flow therethrough.

The arrangement described in the second preferred embodiment with reference to FIG. 14 and the mode switching means described in the fifth preferred embodiment are combined together for desired spare cell test by using the timing signals as shown in FIG. 23 and FIGS. 24A to 24D (Write- $\overline{CAS}$ before $\overline{RAS}$ timing and address key specification).

This arrangement is also effective in the defect reparation test after packaging wherein the use of extra test pads is not permitted. The defect reparation after packaging uses the so-called electrical fuses to be burnt by the electrical signal input from the external pads in place of laser blow as indicated in FIG. 26.

Sixth Preferred Embodiment

Figure 27:
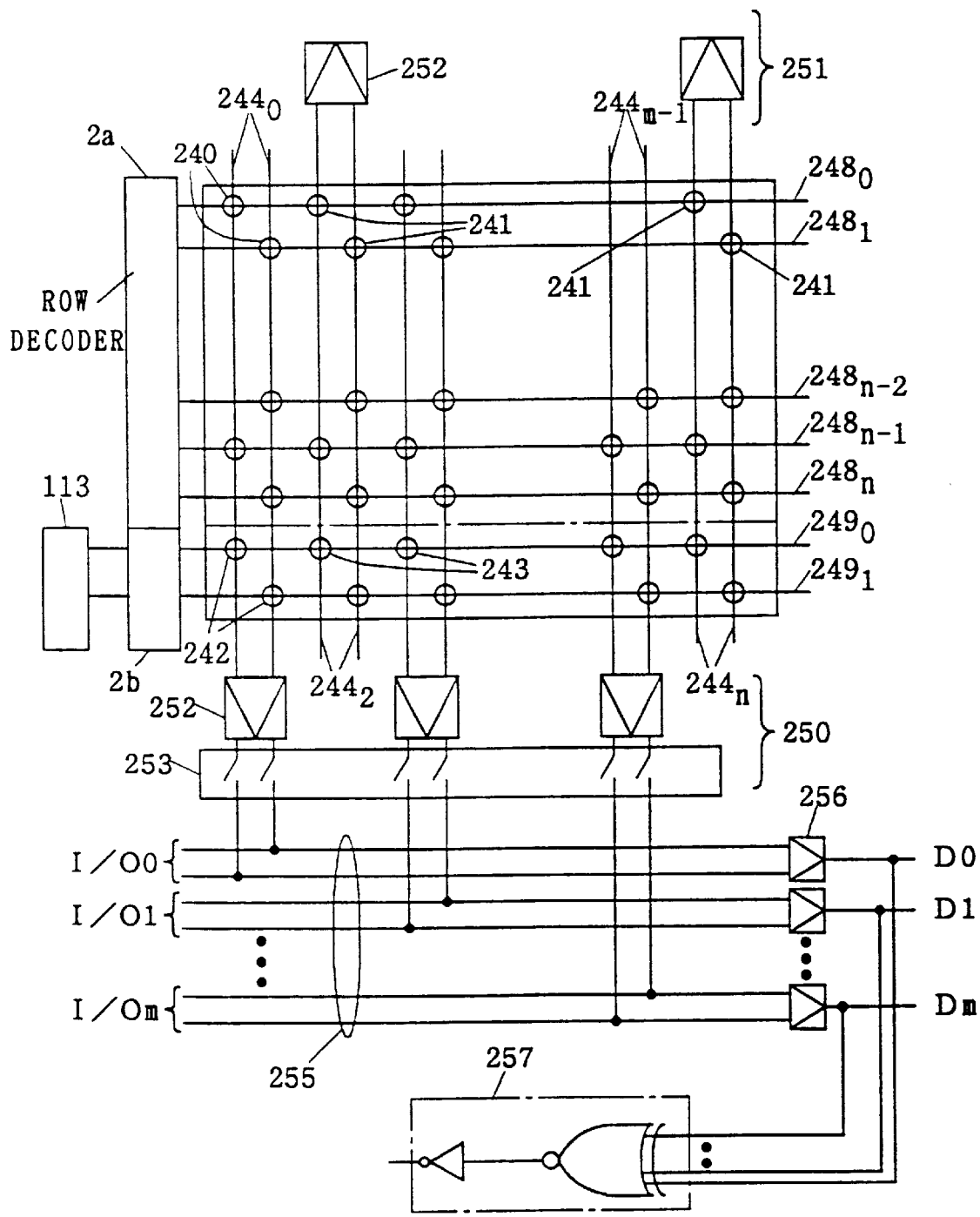
FIG. 27 is a schematic block diagram of the semiconductor memory device according to a sixth preferred embodiment of the present invention.

FIG. 27 is a schematic block diagram of the semiconductor memory device according to a sixth preferred embodiment of the present invention, which illustrates a method and structure for testing a memory cell array including redundant memory cells at high speeds for reparation judgement.

In FIG. 27, the reference numerals 240 and 241 designate normal memory cells in the memory cell array 1; 242 and 243 designate spare memory cells in the memory cell array 1; $244_0$ to $244_n$ designate bit line pairs connected to the normal memory cells 240 and 241 and spare memory cells 242 and 243; $248_0$ to $248_n$ designate word lines connected to the normal memory cells 241 and 242; $249_0$ and $249_1$ designate word lines provided in the spare memory rows and connected to the spare memory cells 243 and 244; 250 and 251 designate areas wherein sense amplifiers are arranged which are provided perpendicularly to the bit line pairs $244_0$ to $244_n$ on opposite sides of the memory cell array 1; 252 designates sense amplifiers connected to the bit line pairs $244_0$ to $244_n$; 253 designates a column selecting circuit for selecting the outputs from the sense amplifiers 252; 255 designates I/O buses for transmitting the outputs from the sense amplifiers 252; 256 designates main amplifiers for amplifying the signals on the I/O buses 255; and 257 designates an arithmetic and output portion for performing the exclusive-OR operation of outputs D0 to Dm from the main amplifiers 256 to output the result of the operation. Like reference numerals and characters are used to designate elements corresponding to those of FIG. 22.

In the test mode, the second test row decoder 113 selectively activates/inactivates the word line $249_0$ and $249_1$ provided in the spare memory cell rows. The data read from the spare memory cells 242 corresponding to the activated word line $249_0$ or $249_1$ are passed through the I/O buses 255 and outputted from the main amplifiers 256. The arithmetic and output portion 257 performs the exclusive-OR operation of all of the data D0 to Dm outputted from the main amplifiers 256 to provide the result of the operation. The data previously written in the spare memory cells 242 by using the second test row decoder 113 have the same logic value. Thus, the output from the arithmetic and output portion 257 is high if at least one of the spare memory cells is defective and a logic value different from the previously written logic value is read.

Testing in parallel the plurality of bits in the spare memory cell rows (or the spare memory cell columns) to be replaced simultaneously in the spare area during the defect reparation and outputting degenerate test information indicated by the product of these output data to the exterior allow the plurality of spare memory cells to be tested at the same time, shortening the test time.

The spare memory cell is not used for defect reparation if even one of the bits to be replaced simultaneously is defective. Thus, the memory cells in one row or in one column should be tested for defect. Since defective bit position information is not required, it is not necessary to consider how to select degenerate bits. Thus, unlike the normal cells, a plurality of degenerate bits may be present in the same spare memory row or column, and a plurality of degenerate bits may be present in a plurality of spare rows or columns.

In this preferred embodiment, the plurality of bits to be simultaneously accessed and tested are written with the same data simultaneously, read subsequently, and checked for coincidence with each other. Then, information about whether or not the test data include a failure is outputted to the exterior.

To simultaneously write the same data, for example, all of the bit line pairs should be made high in unison to activate all of the word lines when the semiconductor memory device enters the test mode.

The plurality of bits to be simultaneously accessed and tested are not stored in adjacent memory cells but in physically separated memory cells, preventing influences of interference between parallel test bits upon the test information and the resultant improper judgement.

Seventh Preferred Embodiment

Figure 28:
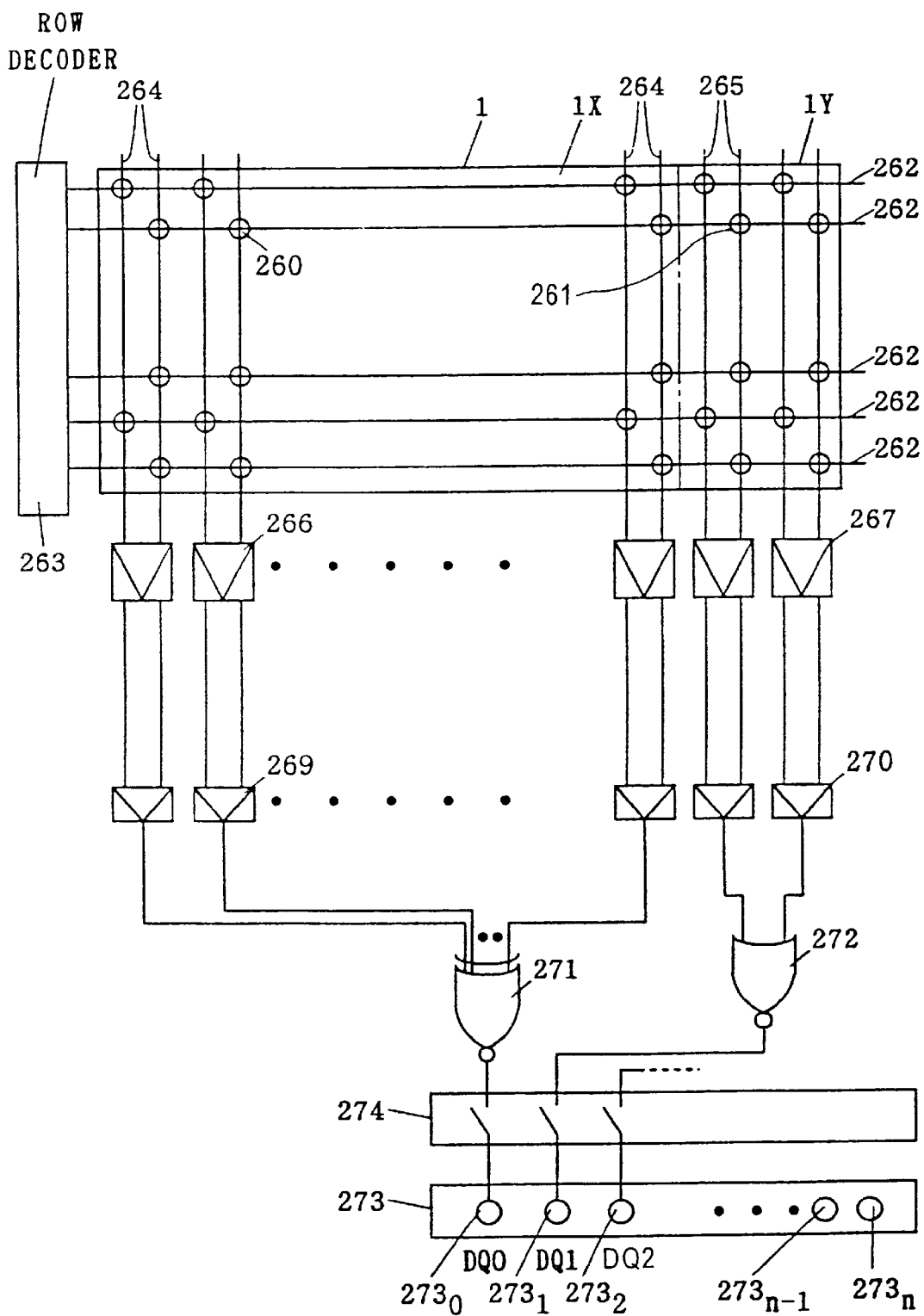
FIG. 28 is a schematic block diagram of the semiconductor memory device according to a seventh preferred embodiment of the present invention.

FIG. 28 is a schematic block diagram of the semiconductor memory device according to a seventh preferred embodiment of the present invention. In FIG. 28, the reference numeral 1 designates a memory cell array including an area 1X wherein normal columns are arranged and an area 1Y wherein spare memory cell columns are arranged and capable of repairing a defect generated in the area 1X by using the spare memory cell columns provided in the area 1Y; 260 designates normal memory cells provided in the area 1X of the memory cell array 1 and each for storing 1-bit data therein; 261 designates spare memory cells provided in the area 1Y of the memory cell array 1 and acting as a substitute for a normal memory cell 260 having a defect, if generated; 262 designates word lines arranged in the rows of the normal memory cells 260 and the spare memory cells 261 for selecting the memory cell to be read or written with data; 263 designates a row decoder for controlling the activation/inactivation of the word line 262 to select the memory cell; 264 designates bit line pairs for transmitting data to be read from or written into the normal memory cells 260 arranged in the normal columns; 265 designates bit line pairs for transmitting data to be read from or written into the spare memory cells 261 arranged in the spare memory cell columns; 266 designates sense amplifiers connected to the bit line pairs 264 for detecting data read from the normal memory cells 260; 267 designates sense amplifiers connected to the bit line pairs 265 for detecting data read from the spare memory cells 261; 269 designates main amplifiers for amplifying the outputs from the sense amplifiers 266; 270 designates main amplifiers for amplifying the outputs from the sense amplifiers 267; 271 designates an exclusive-OR gate for performing the exclusive-OR operation of all of the outputs from the main amplifiers 269; 272 designates an exclusive-OR gate for performing the exclusive-OR operation of all of the outputs from the main amplifiers 270; 273 designates a normal-use terminal used for input/output of data between the memory cell array 1 and the exterior; and 274 designates a selecting circuit for selectively connecting the outputs from the exclusive-OR gates 271 and 272 to the normal-use terminal 273.

The normal-use terminal 273 includes a plurality of normal-use pins $273_0$ to $273_n$ for outputting data $DQ_0$ to $DQ_n$, respectively.

Whether or not the semiconductor memory device is faulty may be judged by finding whether or not a plurality of normal memory cells arranged in a row are required to be replaced with the spare memory cells arranged in the row and whether or not the plurality of normal memory cells are permitted to be replaced with the spare memory cells.

For the judgement, the same data are first written into a plurality of normal memory cells in the same row in the area 1× of the memory cell array 1 wherein the normal memory cells 260 are arranged. Since the same data are written, the data read from the normal memory cells 260 in this row have the same logic value if no defect occurs. If a defect occurs, the data read from the normal memory cells 260 in this row do not have the same logic value, and the exclusive-OR gate 271 outputs "1".

At the same time, the same data are written into the spare memory cells 261. As in the case with the normal memory cells 260, the exclusive-OR gate 272 outputs "1" if a defect occurs in the spare memory cells 261, and the exclusive-OR gate 272 outputs "0" if no defect occurs in the spare memory cells 261.

In this manner, the result of the check of the normal memory cells 260 for defect is outputted to the exterior as the degenerate data. This permits reduction in the number of normal-use pins $273_0$ to $273_n$ connected to a test circuit including the exclusive-OR gate 271 for checking the normal memory cells 260 by the selecting circuit 274 in the test mode. The result of the check of the spare memory cells 261 may be outputted to the normal-use pins $273_1$ to $273_n$ which are not used. The need for the test-only pins is eliminated, reducing the size of the package of the semiconductor memory device.

Further, since the plurality of bits repaired by the spare memory cell row are tested in parallel and the degenerate test data of the plurality of bits are outputted, the failure information of the corresponding normal memory cells in each spare memory cell row or column may be provided at high speeds, and the test time is shortened.

The plurality of bits to be simultaneously accessed and tested are written with the same data simultaneously, read subsequently, and checked for coincidence with each other. Then, information about whether or not the test data include a failure is outputted to the exterior. The plurality of bits to be simultaneously accessed and tested are not stored in adjacent memory cells but in physically separated memory cells, preventing influences of interference between parallel test bits upon the test information and the resultant improper judgement.

Eighth Preferred Embodiment

Figure 29:
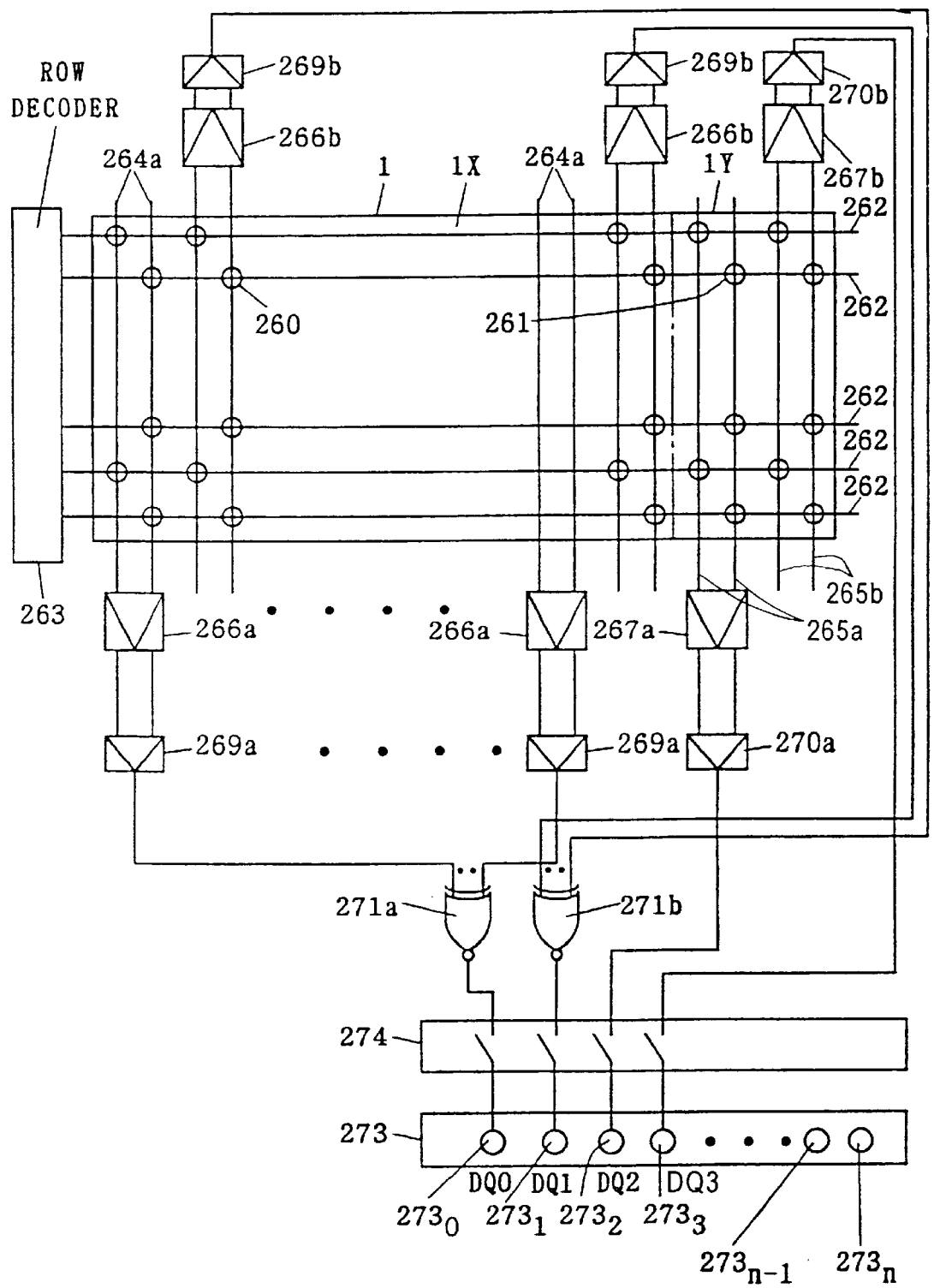
FIG. 29 is a schematic block diagram of the semiconductor memory device according to an eighth preferred embodiment of the present invention.

FIG. 29 is a schematic block diagram of the semiconductor memory device according to an eighth preferred embodiment of the present invention. The semiconductor memory device shown in FIG. 29 differs from the semiconductor memory device shown in FIG. 28 in that the semiconductor memory device of FIG. 29 further comprises sense amplifiers 266a, 266b, 267a, 267b provided on opposite sides of the memory cell array 1.

The normal memory cells are replaced with a spare memory cell column for which the sense amplifiers are disposed on the same side as the sense amplifiers for the normal memory cells. For example, the normal memory cell 260 from which data are read using the bit line pair 264a connected to the sense amplifier 266a is replaced with the spare memory cell 261 from which data are read using the bit line pair 265a connected to the sense amplifier 267a but is not replaced with the spare memory cell 261 from which data are read using the bit line pair 265b.

The normal memory cells and the spare memory cells are accessed simultaneously during the defect reparation. For example, degenerate test data by the parallel test of a plurality of bits are outputted for the normal memory cells, and normal access data are outputted as the test data for the spare memory cells. The degenerate test data DQ0 of the normal memory cell are outputted to the normal-use pin $273_0$, and the test data DQ2 of the spare memory cell are outputted to the normal-use pin $273_2$. The degenerate test data DQ1 of the normal memory cell are outputted to the normal-use pin $273_1$, and the test data DQ3 of the spare memory cell are outputted to the normal-use pin $273_3$. In this manner, a pair of data of the spare memory cell associated with the normal memory cell to be replaced are simultaneously outputted. This provides failure information of the plurality of normal memory cells and a plurality of spare memory cells at the same time, shortening the test time.

During the defect reparation, a plurality of bits to be repaired by the same spare memory cell row or column in the normal memory cell array are tested in parallel and the degenerate test data DQ0, DQ1 of the plurality of bits are outputted to the normal-use pins $273_0$ and $273_1$ whereas the data DQ2 and DQ3 of the corresponding memory cells are outputted from the spare memory cell row or column. This provides failure information of the normal memory cells corresponding to each spare memory cell row or column at high speeds to shorten the test time, simplifying the reparation judgement algorithm.

Figure 35:
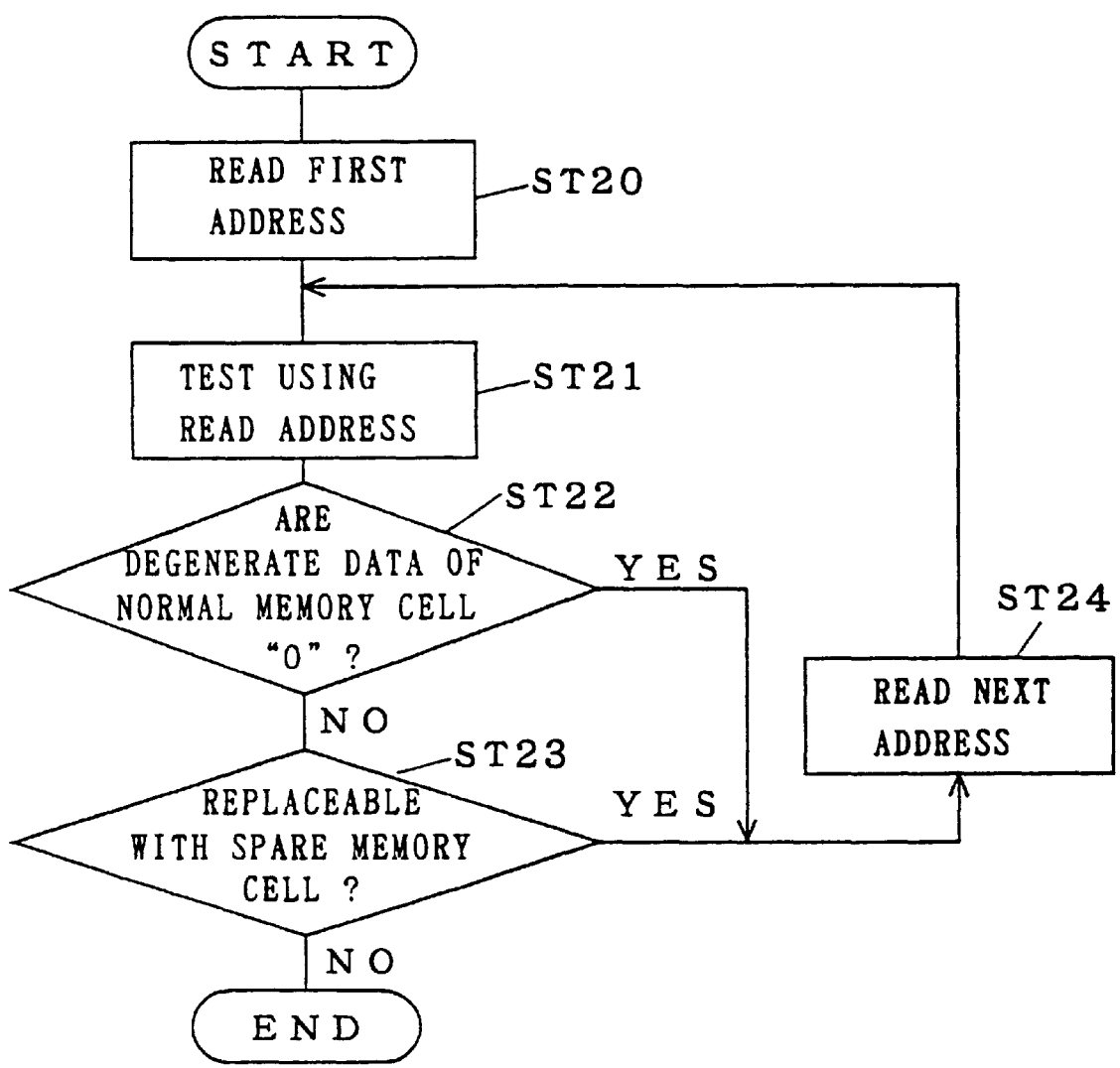
FIG. 35 is a flow chart showing a reparation judgement algorithm according to an eighth preferred embodiment of the present invention.

FIG. 35 is a flow chart illustrating such reparation judgement algorithm. In the step ST20, the address of a memory cell to be tested first is read. The same data are written into the plurality of memory cells arranged on the same word line 262 as the memory cell corresponding to the read address. Data are read from these memory cells (step ST21). The plurality of bit data are checked for coincidence (steps ST22 and ST23). Information about whether or not the test data includes a failure is outputted to the exterior.

Simultaneously testing the normal memory cells 260 and spare memory cells 261 arranged in the same row permits the steps ST22 and ST23 to be performed simultaneously, simplifying the reparation judgement algorithm.

The plurality of bits to be simultaneously accessed and tested are not stored in adjacent memory cells but in physically separated memory cells, preventing influences of interference between parallel test bits upon the test information and the resultant improper judgement.

In the fourth to sixth preferred embodiments, the degenerate bit test output may be provided to a purpose-built test data output terminal. Otherwise, the parallel data input/output system may be used so that normal cell test data are inputted to and outputted from one of a plurality of data input/output terminals and spare cell test data are inputted to and outputted from another one of the data input/output terminals. This system requires no excess test terminals and reduces the chip area and the number of terminals of the package.

Ninth Preferred Embodiment

Figure 36:
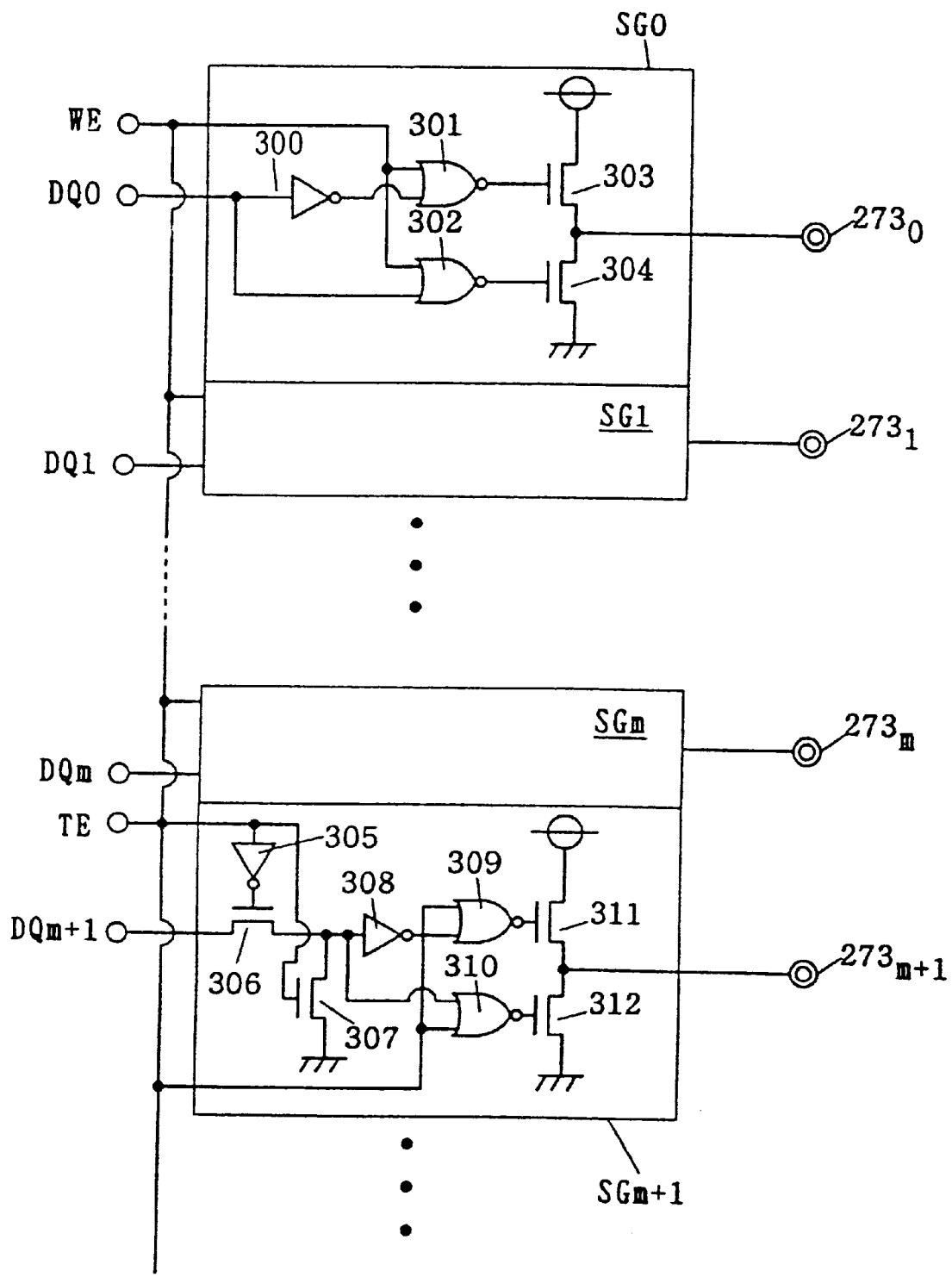
FIG. 36 is a circuit diagram of a switching circuit for use in a ninth preferred embodiment of the present invention.

FIG. 36 is a circuit diagram of the normal-use pins for the semiconductor memory device and switching circuits for switching the input/output mode of the normal-use pins according to a ninth preferred embodiment of the present invention. In FIG. 36, the reference characters SG0 to SGm+1 designate switching circuits connected to the normal-use pins $273_0$ to $273_{m+1}$ for outputting the data DQ0 to DQm+1. The switching circuits SG0 to SGm+1 perform switching as to whether or not the data DQ0 to DQm+1 are outputted to the normal-use pins $273_0$.

The switching circuit SG0 comprises an inverter 300 for inverting the data DQ0 to output the inverted data; a NOR gate 301 for outputting the NOR of the write enable signal WE and the output from the inverter 300; a NOR gate 302 for outputting the NOR of the write enable signal WE and the data DQ0; an N-channel MOS transistor 303 having a drain connected to a power supply potential point, a source connected to the normal-use pin $273_0$, and gate receiving the output from the NOR gate 301; and an N-channel MOS transistor 304 having a source connected to a ground potential point, a drain connected to the normal-use pin $273_0$, and a gate receiving the output from the NOR gate 302.

The switching circuits SG1 to SGm are similar in construction to the switching circuit SG0.

The switching circuit SGm+1 comprises an inverter 305 for inverting a test signal TE to output the inverted signal; a transfer gate 306 controlled to transmit the data DQm+1 by the output from the inverter 305; an N-channel MOS transistor 307 connected between the output of the transfer gate 306 and the ground potential point for selectively fixing the output of the transfer gate 306 at potential in response to the test signal TE; an inverter 308 for inverting the signal at the output of the transfer gate 306; a NOR gate 309 for outputting the NOR of the write enable signal WE and the output from the inverter 308; a NOR gate 310 for outputting the NOR of the write enable signal WE and the signal at the output of the transfer gate 306; an N-channel MOS transistor 311 having a drain connected to the power supply potential point, a source connected to the normal-use Outputting the degenerate data from at least one of the normal-use pins allows the remaining normal-use pins to be used to output a test mode signature signal. pin $273_{m+1}$, and a gate receiving the output from the NOR gate 309; and an N-channel MOS transistor 312 having a source connected to the ground potential point, a drain connected to the normal-use pin $273_{m+1}$, and a gate receiving the output from the NOR gate 310.

Specifically, the terminals DQ1 to DQn act as the data input/output terminals during the normal use (in the normal mode) as depicted in FIG. 28 or 29. When a degenerate data input/output mode starts (TE=H), the terminals $DQ_{m+1}$ to DQn other than the terminals DQ0 to DQm used for degenerate data input/output are used to output a signal for identifying the establishment of the test mode.

This allows the detection of improper execution of a test mode in operation due to faulty operation to provide a signature signal to the exterior. Thus, the improper execution of the test mode in operation is found from the exterior. The reliability of the test is increased and test errors are avoided.

While the invention has been described in detail, the foregoing description is in all aspects illustrative and not restrictive. It is understood that numerous other modifications and variations can be devised without departing from the scope of the invention.

What is claimed is:

1. A semiconductor memory device comprising:

normal memory cells;

a decoder for simultaneously selecting a plurality of normal memory cells among said normal cells and at least one spare memory cell among said spare memory cells; and test circuit for producing a result of detecting whether data read from said plurality of normal memory cells match or not, and producing test data corresponding to data read from said at least one spare memory cell.

2. The semiconductor memory device according to claim 1, wherein said at least one spare memory cell includes a plurality of spare memory cells, and said test data designates whether data read from said plurality of spare memory cells match or not.

3. The semiconductor memory device according to claim 1, wherein said test data is data read from said at least one spare memory cell.

4. The semiconductor memory device according to claim 1, further comprising data output terminals for outputting data in a normal operation mode, wherein said test circuit outputs result data associated with the result of detecting to a first data output terminal among said data output terminals, and outputs said test data to a second data output terminals among said data output terminals.

5. The semiconductor memory device according to claim 4, wherein a signal related with the test mode is provided to one of the remaining data output terminals.

6. The semiconductor memory device according to claim 1, wherein each of said plurality of normal memory cells is capable of being replaced with said at least one spare memory cell.

* * * * *